US010720724B2

(12) United States Patent
Pitten et al.

(10) Patent No.: US 10,720,724 B2
(45) Date of Patent: *Jul. 21, 2020

(54) ELECTRICAL INTERCONNECTION SYSTEM

(71) Applicant: Amphenol Corporation, Wallingford, CT (US)

(72) Inventors: Tom Pitten, Merrimack, NH (US); Mark W. Gailus, Concord, MA (US); Marc B. Cartier, Jr., Dover, NH (US); David Levine, Amherst, NH (US); Donald A. Girard, Jr., Bedford, NH (US)

(73) Assignee: Amphenol Corporation, Wallingford, CT (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/401,967

(22) Filed: May 2, 2019

(65) Prior Publication Data

US 2019/0260147 A1  Aug. 22, 2019

Related U.S. Application Data

(60) Continuation of application No. 15/985,158, filed on May 21, 2018, now Pat. No. 10,367,287, which is a
(Continued)

(51) Int. Cl.
*H01R 13/03* (2006.01)
*H01R 13/05* (2006.01)
(Continued)

(52) U.S. Cl.
CPC .......... *H01R 13/03* (2013.01); *H01R 13/055* (2013.01); *H01R 13/42* (2013.01); *H01R 13/646* (2013.01);
(Continued)

(58) Field of Classification Search
CPC ...... H01R 13/03; H01R 13/055; H01R 13/42; H01R 13/646; H01R 3/11; H01R 12/716
(Continued)

(56) References Cited

U.S. PATENT DOCUMENTS 3,011,143 A     11/1961   Dean
3,646,246 A  *  2/1972   Olney, Jr. .............. H05K 3/222
                                                          174/251

(Continued)

FOREIGN PATENT DOCUMENTS

CN        101416357 A      4/2009
CN         1694308 B       4/2010
(Continued)

OTHER PUBLICATIONS

U.S. Appl. No. 15/098,498, filed Apr. 14, 2016, Pitten et al.
(Continued)

*Primary Examiner* — Harshad C Patel
(74) *Attorney, Agent, or Firm* — Wolf, Greenfield & Sacks, P.C.

(57) ABSTRACT

Embodiments related to electrical connectors including superelastic components are described. The high elastic limit of superelastic materials compared to conventional connector materials may allow for designs which provide reliable connections and high frequency operation. Superelastic components also may enable connector designs with higher densities of connections. In some embodiments, a connector includes one or more superelastic elongated members forming the mating contacts of the connector. The superelastic elongated members deform within one or more conductive receptacles to generate a suitable contact force. The conductive receptacles may include a plurality of protrusions arranged to deflect the superelastic elongated members during mating. A superelastic component may also be
(Continued)

provided in a receiving portion of a connector, and may form a portion of a conductive receptacle.

28 Claims, 20 Drawing Sheets

Related U.S. Application Data division of application No. 15/098,498, filed on Apr. 14, 2016, now Pat. No. 9,991,617.

(60) Provisional application No. 62/147,450, filed on Apr. 14, 2015.

(51) Int. Cl.
| | |
|---|---|
| *H01R 13/42* | (2006.01) |
| *H01R 13/646* | (2011.01) |
| *H01R 12/71* | (2011.01) |
| *H01R 13/11* | (2006.01) |
| *H01R 107/00* | (2006.01) |

(52) U.S. Cl.
CPC ............ *H01R 12/716* (2013.01); *H01R 13/11* (2013.01); *H01R 2107/00* (2013.01)

(58) Field of Classification Search
USPC ..................................................... 438/161, 80
See application file for complete search history.

(56) References Cited

U.S. PATENT DOCUMENTS

| | | | |
|---|---|---|---|
| 3,959,691 | A | 5/1976 | Clarke |
| 5,098,305 | A | 3/1992 | Krajewski et al. |
| 5,098,311 | A | 3/1992 | Roath et al. |
| 5,509,814 | A | 4/1996 | Mosquera |
| 5,587,568 | A | 12/1996 | Lothamer et al. |
| 6,430,442 | B1 | 8/2002 | Peters et al. |
| 6,532,654 | B2 | 3/2003 | Guerin et al. |
| 6,801,436 | B2 | 10/2004 | Pearson et al. |
| 7,083,433 | B2 | 8/2006 | Misawa et al. |
| 7,153,152 | B1 | 12/2006 | Eby et al. |
| 7,300,444 | B1 * | 11/2007 | Nielsen ............... A61B 17/0057 227/175.1 |
| 7,500,861 | B2 | 3/2009 | Harkab et al. |
| 7,976,326 | B2 | 7/2011 | Stoner et al. |
| 8,211,227 | B2 | 7/2012 | Chung et al. |
| 8,277,241 | B2 | 10/2012 | Horchler et al. |
| 8,282,746 | B2 | 10/2012 | Schuh et al. |
| 8,998,645 | B2 | 4/2015 | Vanaleck et al. |
| 9,018,117 | B2 | 4/2015 | Schuh et al. |
| 9,450,344 | B2 | 9/2016 | Cartier, Jr. et al. |
| 9,509,101 | B2 | 11/2016 | Cartier, Jr. et al. |
| 9,512,039 | B2 | 12/2016 | Schuh et al. |
| 9,543,718 | B2 | 1/2017 | Dandl et al. |
| 9,590,344 | B2 | 3/2017 | Krishnamoorthy |
| 9,772,201 | B2 * | 9/2017 | Mase .................. G01D 11/245 |
| 9,991,617 | B2 | 6/2018 | Pitten et al. |
| 10,367,287 | B2 | 7/2019 | Pitten et al. |
| 2003/0181942 | A1 * | 9/2003 | Sutton ............... A61B 17/0057 606/200 |
| 2004/0023524 | A1 | 2/2004 | Ashman et al. |
| 2006/0003620 | A1 | 1/2006 | Daily et al. |
| 2007/0042639 | A1 | 2/2007 | Manter et al. |
| 2010/0156171 | A1 * | 6/2010 | Sechrist ................... H02J 1/08 307/9.1 |
| 2010/0167569 | A1 | 7/2010 | Stoner |
| 2011/0036294 | A1 * | 2/2011 | Hillabrand .......... C23C 16/4418 118/723 R |
| 2012/0202363 | A1 | 8/2012 | McNamara et al. |
| 2013/0210286 | A1 | 8/2013 | Golko |
| 2014/0213124 | A1 * | 7/2014 | Wu ........................ H01R 13/05 439/885 |
| 2014/0253163 | A1 * | 9/2014 | Suzuki ............... G01R 1/06722 324/755.05 |
| 2014/0329416 | A1 | 11/2014 | Golko et al. |
| 2015/0236451 | A1 | 8/2015 | Cartier, Jr. et al. |
| 2015/0236452 | A1 | 8/2015 | Cartier, Jr. et al. |
| 2016/0308296 | A1 | 10/2016 | Pitten et al. |
| 2018/0269612 | A1 | 9/2018 | Pitten et al. |

FOREIGN PATENT DOCUMENTS

| | | |
|---|---|---|
| EP | 1594189 A1 | 11/2005 |
| JP | 2009-123390 A | 6/2009 |
| KR | 10-1503884 B1 | 3/2015 |
| TW | 105111621 | 12/2019 |
| WO | WO 2005/013436 A1 | 2/2005 |

OTHER PUBLICATIONS

U.S. Appl. No. 15/985,158, filed May 21, 2018, Pitten et al.
Serial No. PCT/US2016/027470, Date of Mailing Jul. 26, 2016, International Search Report and Written Opinion.
Serial No. PCT/US2016/027470, Date of Mailing Oct. 26, 2017, International Preliminary Report on Patentability.
International Search Report and Written Opinion for International Application No. PCT/US2016/027470 dated Jul. 26, 2016.
International Preliminary Report on Patentability for International Application No. PCT/US2016/027470 dated Oct. 26, 2017.
Bellouard, Shape Memory Alloys for Microsystems: a review from a material research perspective. Micro-/Nano-Scale Engineering, Mechanical Engineering Department, Eindhoven University of Technology, Eindhoven. 2008. 16 pages.
Desroches et al., Cyclic Properties of Superelastic Shape Memory Alloy Wires and Bars. Journal of Structural Engineering. ASCE. 2004. 9 pages.
Otsuka et al., Table of Contents, Chapter 1.1: Invitation to shape memory effect and the notion of martensitic transformation, and Chapter 10.4: Electrical connectors. Shape Memory Materials. Cambridge University Press, Cambridge, United Kingdom. 1999. 15 pages. ISBN: 0521663849.
Stoeckel, The Shape Memory Effect—Phenomenon, Alloys and Applications. Proceedings: Shape Memory Alloys for Power Systems EPRI. Nitinol. 1995.14 pages.
Taiwanese communication for Taiwanese Application No. 105111621 dated Dec. 24, 2019.

* cited by examiner

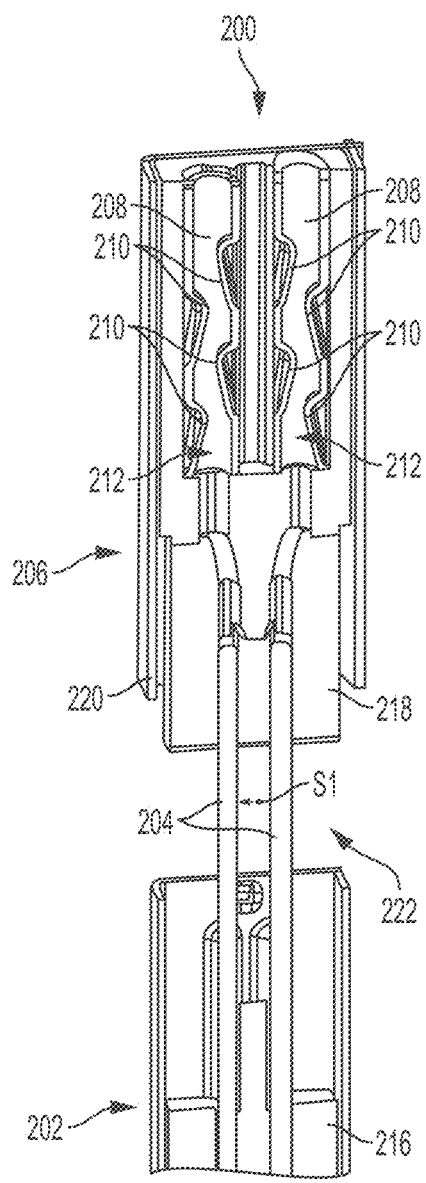
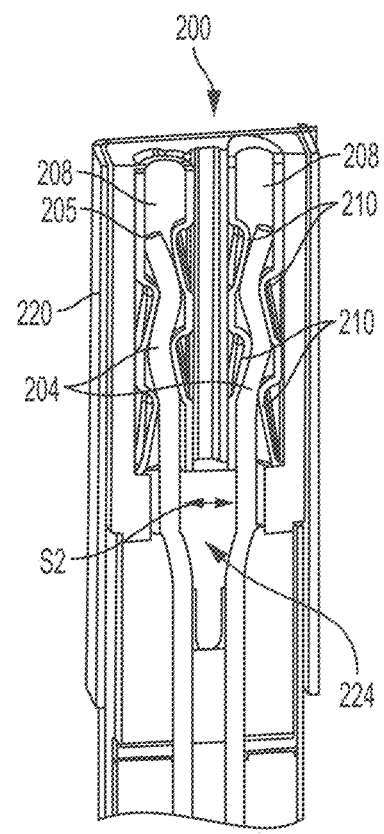
FIG. 2A
FIG. 2B

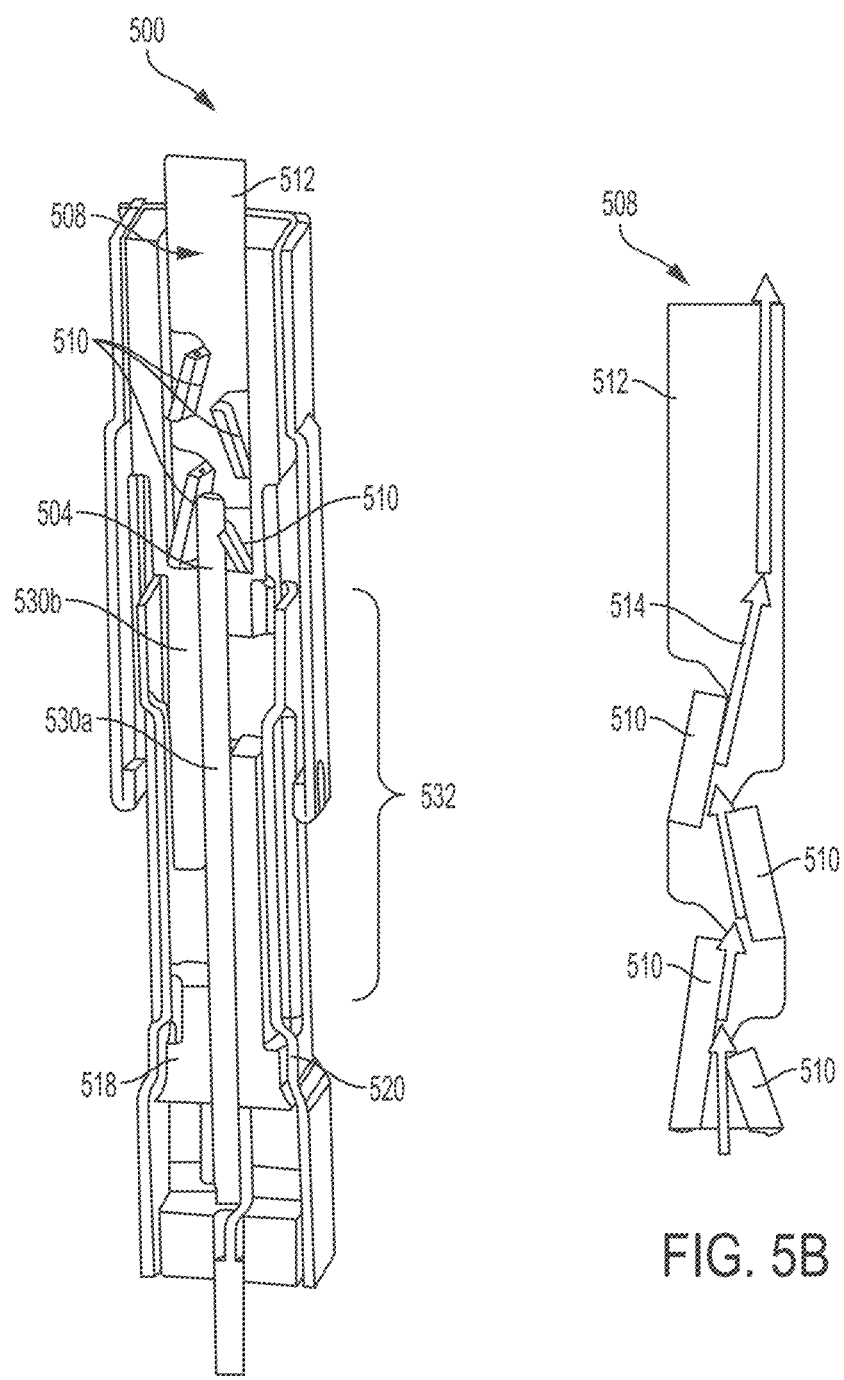

ELECTRICAL INTERCONNECTION SYSTEM

RELATED APPLICATION

This application is a continuation of U.S. application Ser. No. 15/985,158, filed on May 21, 2018, entitled "ELECTRICAL INTERCONNECTION SYSTEM," which is a divisional of U.S. application Ser. No. 15/098,498, filed on Apr. 14, 2016, now U.S. Pat. No. 9,991,617, entitled "ELECTRICAL INTERCONNECTION SYSTEM," which claims the benefit of and priority under 35 U.S.C. § 119(e) to U.S. Provisional Patent Application Ser. No. 62/147,450, filed on Apr. 14, 2015, entitled "ELECTRICAL CONNECTORS." The entire contents of these applications are incorporated herein by reference in their entirety for all purposes.

FIELD

Disclosed embodiments are related to interconnection systems, such as those including electrical connectors, used to interconnect electronic assemblies.

DISCUSSION OF THE RELATED ART

Electrical connectors are used in many electronic systems. It is generally easier and more cost effective to manufacture a system as separate electronic assemblies, such as printed circuit boards ("PCBs"), which may be joined together with electrical connectors. A known arrangement for joining several printed circuit boards is to have one printed circuit board serve as a backplane. Other printed circuit boards, called "daughterboards" or "daughtercards," may be connected through the backplane.

A known backplane is a printed circuit board onto which many connectors may be mounted. Conducting traces in the backplane may be electrically connected to signal conductors in the connectors so that signals may be routed between the connectors. Daughtercards may also have connectors mounted thereon. The connectors mounted on a daughtercard may be plugged into the connectors mounted on the backplane. In this way, signals may be routed among the daughtercards through the backplane. The daughtercards may plug into the backplane at a right angle. The connectors used for these applications may therefore include a right angle bend and are often called "right angle connectors."

Connectors may also be used in other configurations for interconnecting printed circuit boards and for interconnecting other types of devices, such as cables, to printed circuit boards. Sometimes, one or more smaller printed circuit boards may be connected to another larger printed circuit board. In such a configuration, the larger printed circuit board may be called a "mother board" and the printed circuit boards connected to it may be called daughterboards. Also, boards of the same size or similar sizes may sometimes be aligned in parallel. Connectors used in these applications are often called "stacking connectors" or "mezzanine connectors."

Regardless of the exact application, electrical connector designs have been adapted to mirror trends in the electronics industry. Electronic systems generally have gotten smaller, faster, and functionally more complex. Because of these changes, the number of circuits in a given area of an electronic system, along with the frequencies at which the circuits operate, have increased significantly in recent years. Current systems pass more data between printed circuit boards and require electrical connectors that are electrically capable of handling more data at higher speeds than connectors of even a few years ago.

One of the difficulties in making a high density, high speed connector is that electrical conductors in the connector can be so close that there can be electrical interference between adjacent signal conductors. To reduce interference, and to otherwise provide desirable electrical properties, shield members are often placed between or around adjacent signal conductors. The shields prevent signals carried on one conductor from creating "crosstalk" on another conductor. The shield also impacts the impedance of each conductor, which can further contribute to desirable electrical properties. Shields can be in the form of grounded metal structures or may be in the form of electrically lossy material.

Other techniques may be used to control the performance of a connector. Transmitting signals differentially can also reduce crosstalk. Differential signals are carried on a pair of conducting paths, called a "differential pair." The voltage difference between the conductive paths represents the signal. In general, a differential pair is designed with preferential coupling between the conducting paths of the pair. For example, the two conducting paths of a differential pair may be arranged to run closer to each other than to adjacent signal paths in the connector. No shielding is desired between the conducting paths of the pair, but shielding may be used between differential pairs. Electrical connectors can be designed for differential signals as well as for single-ended signals.

Maintaining signal integrity can be a particular challenge in the mating interface of the connector. At the mating interface, force must be generated to press conductive elements from the separable connectors together so that a reliable electrical connection is made between the two conductive elements. Frequently, this force is generated by spring characteristics of the mating contact portions in one of the connectors. For example, the mating contact portions of one connector may contain one or more members shaped as beams. As the connectors are pressed together, these beams are deflected by a mating contact portion, shaped as a blade or pin, in the other connector. The spring force generated by the beam as it is deflected provides a contact force.

For mechanical reliability, many contacts have multiple beams. In some instances, the beams are opposing, pressing on opposite sides of a mating contact portion of a conductive element from another connector. The beams may alternatively be parallel, pressing on the same side of a mating contact portion.

Regardless of the specific contact structure, the need to generate mechanical force imposes requirements on the shape of the mating contact portions. For example, the mating contact portions must be large enough to generate sufficient force to make a reliable electrical connection.

SUMMARY

The inventors have recognized and appreciated that the performance of interconnection systems may be significantly improved by providing electrical connectors that incorporate superelastic materials. The use of superelastic materials may allow for connector designs with contact shapes that provide reliable contact forces in relatively small areas, enabling dense connectors and/or connectors which may improve performance with high frequency signals.

According to one aspect, an electrical interconnection system includes a first connector comprising one or more mating contacts and a second, mating connector comprising one or more conductive receptacles. The one or more mating contacts are misaligned with the one or more conductive receptacles when the interconnection system is in an unmated configuration. Moving the interconnection to a mated configuration causes the one or more mating contacts to deform to create one or more contact points with the conductive receptacles.

According to another aspect, an electrical interconnection system includes a first connector comprising one or more superelastic components, and a second, mating connector comprising one or more conductive receptacles. The one or more superelastic components deform without yielding within the one or more conductive receptacles when the interconnection system is in a mated configuration.

According to a further aspect, an electrical connector comprises a receiving portion including a housing constructed and arranged to receive a connector blade. At least one superelastic component is disposed in the housing. The superelastic component deforms within the housing to create a contact force against the connector blade when the connector blade is inserted into the receiving portion.

According to yet another aspect, an electrical connector includes one or more superelastic portions having a wave shape. The superelastic portions are constructed and arranged such that the wave shape is flattened during mating to generate a contact force.

According to still another aspect, an electrical connector includes one or more shape memory components having a first shape below a transition temperature, and a second shape above the transition temperature. The electrical connector further comprises one or more receptacles constructed and arranged to receive the one or more shape memory components.

According to another aspect, an electrical connector includes a plurality of contact elements disposed in an array. Each of the plurality of contact elements comprises a contact tail and a mating contact portion. The mating contact portion comprises a superelastic elongated member.

According to yet another aspect, an electrical connector comprises a housing and a plurality of contact elements disposed in an array. Each of the contact plurality of contact elements comprises a contract tail and a mating contact portion. The mating contact portion comprises opposing conductive surfaces fixedly held within the housing. The mating contact portion further comprises at least one projection extending from at least one of the opposing conductive surfaces.

It should be appreciated that the foregoing concepts, and additional concepts discussed below, may be arranged in any suitable combination, as the present disclosure is not limited in this respect. Further, other advantages and novel features of the present disclosure will become apparent from the following detailed description of various non-limiting embodiments when considered in conjunction with the accompanying figures.

BRIEF DESCRIPTION OF DRAWINGS

The accompanying drawings are not intended to be drawn to scale. In the drawings, each identical or nearly identical component that is illustrated in various figures may be represented by a like numeral. For purposes of clarity, not every component may be labeled in every drawing. In the drawings:

FIG. 2A is a cross-sectional view of one embodiment of a portion of an interconnection system including two superelastic wires and two associated conductive receptacles, in an unmated configuration;

FIG. 2B is a cross-sectional view of the portion of an interconnection system of FIG. 2A, in a mated configuration;

FIG. 5A is a cross-sectional view of another embodiment of a portion of an interconnection system including a superelastic wire and a conductive receptacle including a plurality of angled walls;

FIG. 5B is a schematic representation of the path of the superelastic wire in the mated configuration;

DETAILED DESCRIPTION

Figure 1:
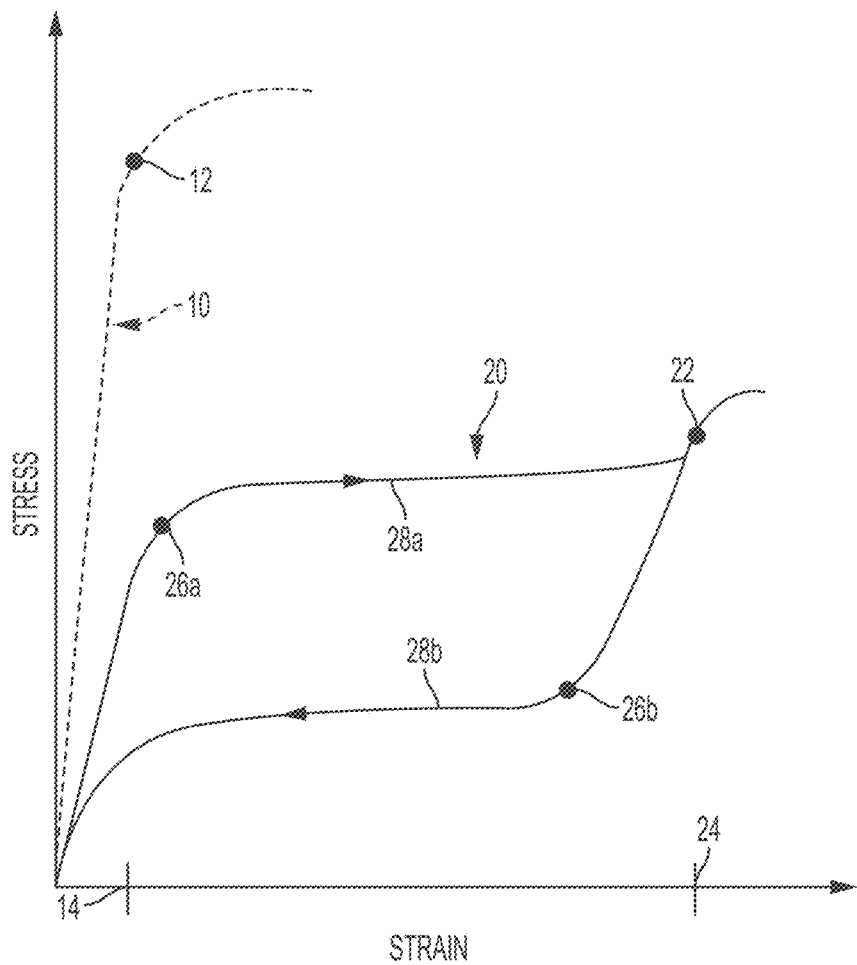
FIG. 1 is a plot showing representative stress-strain curves for conventional materials and superelastic materials.

The inventors have recognized and appreciated that the performance of interconnection systems may be significantly improved by providing electrical connectors that incorporate shape memory materials exhibiting superelastic behavior (also known as pseudoelasticity), herein referred to as superelastic materials. Improved performance may be achieved, for example, by using conductive superelastic members to provide mating contact structures that reduce or eliminate unterminated "stubs." Alternatively or additionally, superelastic materials may be formed with contact shapes that provide reliable contact forces in relatively small areas, enabling dense connectors. Moreover, in some embodiments, spacing or other characteristics of the mating contact portions may be altered by deformation of the superelastic material. As a result of such deformation, the impedance of the mating contact portions may be varied during mating, which may provide a uniform impedance or impedance transition through the mating interface as the connector mates with a mating connector.

Superelastic materials may be characterized by the amount of strain required for those materials to yield, with superelastic materials tolerating a higher strain before yielding. Additionally, the shape of the stress-strain curve for a superelastic material includes a "superelastic" region. Illustrative stress-strain curves for a conventional and superelastic material are shown in FIG. 1.

Superelastic materials may include shape memory materials that undergo a reversible martensitic phase transformation when a suitable mechanical driving force is applied. The phase transformation may be a diffusionless solid-solid phase transformation which has an associated shape change; the shape change allows superelastic materials to accommodate relatively large strains compared to conventional (i.e. non-superelastic) materials, and therefore superelastic materials often exhibit a much larger elastic limit than traditional materials. The elastic limit is herein defined as the maximum strain to which a material may be reversibly deformed without yielding.

Superelastic behavior is exhibited by many shape memory materials which exhibit the shape memory effect. Similar to superelasticity, the shape memory effect involves a reversible transformation between the austenite and martensite phases with a corresponding shape change. However, the transformation in the shape memory effect is driven by a temperature change, rather than mechanical deformation as in superelasticity. In particular, a material which exhibits the shape memory effect may reversibly transition between two predetermined shapes upon a temperature change which crosses a transition temperature. For example, a shape memory material may be "trained" to have a first shape at low temperatures (below the transition temperature), and a second, different shape above the transition temperature. Training a particular shape for a shape memory material may be accomplished by constraining the shape of the material and performing a suitable heat treatment.

FIG. 1 depicts representative stress-strain curves for conventional materials and for superelastic materials, which in this example are materials that undergo a reversible martensitic phase change from an austenite phase to a martensite phase. The stress-strain curve 10 for a conventional material exhibits elastic behavior up to a yield point 12 corresponding to an elastic limit 14. The stress strain curve for a superelastic material is depicted as curve 20; the arrows on the curve indicate the stress-strain response for loading and unloading. During loading, superelastic materials exhibit elastic behavior up to a first transition point 26a, after which the transformation from austenite to martensite begins and the stress-strain curve exhibits a characteristic plateau 28a, herein referred to as the superelastic regime. In the superelastic regime, the shape change associated with the martensite transformation allows the material to accommodate additional strain without a significant corresponding increase in stress. When all of the superelastic material has been converted to martensite, the superelastic material may reach a yield point 22 corresponding to an elastic limit 24. During unloading, the martensite phase transforms back to the austenite phase; the transformation begins at a second transition point 26b and may occur at a lower stress than the transformation during loading, as indicated by the second plateau 28b.

As described above, the elastic limit of superelastic materials may be substantially larger than those of conventional materials. For example, some superelastic materials may be deformed to about 7% to 8% strain or more without yielding; in contrast, many conventional materials, such as metal alloys commonly used in electrical connectors, yield at 0.5% strain or less. Therefore, superelastic materials may enable designs for separable electrical connectors which utilize relatively large local deformations that are not possible with conventional materials without resulting in yielding and associated permanent damage to the connector. In particular, the inventors have recognized and appreciated that the large elastic limit of superelastic materials may be beneficial for providing reliable connections in the mating interface of an electrical connector. For example, the substantially flat stress-strain response of superelastic materials in the superelastic regime may allow for components made from superelastic materials to provide the same contact force over a large range of deformations. Therefore, superelastic components may allow for design tolerances that are larger compared to what is possible with conventional materials.

In some embodiments, the plateau 28a in the stress-strain response of a superelastic material may enable connector designs which feature a substantially constant mating force over an extended range of deformations. Specifically, as described above, when a superelastic material is deformed in the superelastic regime, additional applied strain may be accommodated via a phase transition from an austenite phase to a martensite phase without a substantial increase in the applied stress. Such a response may allow for more facile and/or reliable connections between components of an interconnection system. For example, in some embodiments, an initial deformation applied to a connector element made from superelastic material during an initial stage of the mating process may be sufficient to deform the connector element into the superelastic regime. Therefore, the remainder of the mating process, including subsequent deformation of the superelastic connector element, may be carried out with little, if any, additional required force. In contrast, connector elements made from conventional materials may require an increasing force to achieve additional deformation.

Accordingly, in some embodiments, a connector may be designed with a nominal mating state in which beams or other members made of superelastic materials are deflected near the middle of the superelastic region. Because of manufacturing tolerances in the connector and the system in which the connector might be installed, members in a connector may be deflected more or less than designed for a nominal mating state. In a connector made with superelastic members, over a relatively wide working range, more or less deflection will still result in the members operating in their superelastic region. As a result, the contact force provided by those members will be approximately the same over the entire working range. Such a uniform force, despite variations attributable to manufacturing tolerances, may provide more reliable electrical connectors and electronic systems using those connectors.

Furthermore, the inventors have appreciated that superelastic materials may enable connector designs which may provide improved signal integrity for very high frequency signals, allow for a higher density of connectors, and/or provide improved reliability over time compared to existing connector designs which are limited by the mechanical properties of conventional connector materials.

Accordingly, in some embodiments, an electrical connector may include one or more components made from superelastic materials which are constructed and arranged to substantially deform during mating to create the contact force required for a reliable electrical connection. Such embodiments may also include a portion of a connector which is shaped and/or configured to cause such deformation. For example, in some embodiments, a male portion of a connector may comprise one or more wires made from a superelastic material, herein referred to as superelastic wires, which are substantially undeformed when the connector is in an unmated configuration. A female portion of the connector may comprise one or more conducting receptacles which define a passage or channel sized and shaped to receive the wires, and the receptacles may further include one or more protrusions transverse to the axis of the channel. During mating, the wires are inserted into the passages in a direction aligned with the axis of the channel, and the protrusions cause the wires to deform such that the wires contact the protrusions and/or the sidewalls of the passages. The deformed shape of the superelastic wires provides a restoring force which creates the contact force necessary to form a reliable electrical connection. Furthermore, the force may be sufficient to break through any oxide on the surfaces of the portions of the connectors which come into contact. When unmated, the superelastic wires may return to their original, undeformed geometry. It should be understood that in such embodiments, the use of superelastic components may enable designs in which local strains in the superelastic components would exceed the elastic limit of conventional materials, and therefore such embodiments would not be possible using conventional materials without causing permanent deformation and associated damage to the connector.

FIGS. 2A and 2B depict an illustrative embodiment of a portion of an interconnection system 200 according to the present disclosure. The interconnection system comprises a male portion 202 and a female portion 206. These portions may represent the mating interface portions of mating connectors. For example, male portion 202 may be a portion of a backplane connector and female portion 206 may be a portion of a daughtercard connector configured for mating to the backplane connector. However, it should be appreciated that the mating contact portions illustrated in FIGS. 2A and 2B, and throughout this disclosure, may be used in any suitable mating configuration. For example, one or more of the mating interface portions may be a portion of a cable connector or a stacking connector.

Moreover, it should be appreciated that FIGS. 2A and 2B show only a portion of the mating interface of a connector. For simplicity, in some instances, only a single conductive element or a single pair of conductive elements is illustrated. However, the illustrated portions may be repeated multiple times in a connector to provide an array, which may be a two dimensional array, of conductive elements. The spacing of the array may provide a spacing between conductive elements on the order of 2.5 mm or less, with some embodiments having spacing between 0.25 and 2.5 mm.

In the embodiment illustrated, the illustrated portion is a portion of a module for an electrical connector, including a signal pair and surrounding shielding acting as a ground conductor. Such modules, and connectors made from such modules, are described in co-pending U.S. application Ser. Nos. 14/603,300 and 14/603,294, which are hereby incorporated by reference in their entireties. As described in those applications, the mating contact portions may be formed at one end of a conductive element passing through a connector. An opposite end of the conductive elements may include a contact tail, adapted for attaching to a printed circuit board or other substrate to which the connector is attached. The contact tail and the mating contact portion may be joined by an intermediate portion passing through the connector. In some embodiments, some or all of these portions of the conductive elements may be made of superelastic material. For example, the mating contact portions and the contact tails may be superelastic. Those portions may be joined by an intermediate portion that is more conductive. In other embodiments, only the mating contact portion in one module may be formed of a superelastic material, and all other portions of the conductive elements may be formed of a metal conventionally used in an electrical connector.

Depending on the particular embodiment, the superelastic material may have a suitable intrinsic conductivity or may be made suitably conductive by coating or attachment to a conductive material. For example, a suitable conductivity may be in the range of about 1.5 $\mu\Omega$cm to about 200 $\mu\Omega$cm. Examples of superelastic materials which may have a suitable intrinsic conductivity include, but are not limited to, metal alloys such as copper-aluminum-nickel, copper-aluminum-zinc, copper-aluminum-manganese-nickel, nickel-titanium (e.g. Nitinol), and nickel-titanium-copper. Additional examples of metal alloys which may be suitable include Ag—Cd (approximately 44-49 at % Cd), Au—Cd (approximately 46.5-50 at % Cd), Cu—Al—Ni (approximately 14-14.5 wt %, approximately 3-4.5 wt % Ni), Cu—Au—Zn (approximately 23-28 at % Au, approximately 45-47 at % Zn), Cu—Sn (approximately 15 at % Sn), Cu—Zn (approximately 38.5-41.5 wt % Zn), Cu—Zn—X (X=Si, Sn, Al, Ga, approximately 1-5 at % X), Ni—Al (approximately 36-38 at % Al), Ti—Ni (approximately 49-51 at % Ni), Fe—Pt (approximately 25 at % Pt), and Fe—Pd (approximately 30 at % Pd).

In some embodiments, a particular superelastic material may be chosen for its mechanical response, rather than its electronic properties, and may not have a suitable intrinsic conductivity. In such embodiments, the superelastic material may be coated with a more conductive metal, such as silver, to improve the conductivity. For example, a coating may be applied with a chemical vapor deposition (CVD) process, or any other suitable coating process, as the disclosure is not so limited. Coated superelastic materials also may be particularly beneficial in high frequency applications in which most of the electrical conduction occurs near the surface of conductors. As described in more detail below, in some embodiments, the conductivity of a connector element including a superelastic material may be improved by attaching a superelastic material to a conventional material which may have a higher conductivity than the superelastic material. For example, a superelastic material may be employed only in a portion of the connector element which may be subjected to large deformations, and other portions of the connector which do not deform significantly may be made from a conventional (high conductivity) material.

An electrical connector of the type that might be improved through the use of superelastic materials is illustrated below in FIG. 17. That connector is configured as a right angle, backplane connector. However, it should be appreciated that the specific form of connector is not a limitation on the invention. Mating interfaces as described herein may be applied, for example, in stacking connectors, mezzanine connectors, or cable connectors, for example. Alternatively or additionally, disclosed techniques may also be applied in other separable interfaces in electronic systems, such as between components and printed circuit boards or between sockets and electronic devices inserted into the sockets.

In some embodiments, the connectors, or other components of an electrical interconnection system, incorporating superelastic materials may be designed to propagate signals as a differential pair. Accordingly, some embodiments may be described in connection with the mating portions of a differential pair of conductive elements, such as may exist at the mating interface of connectors as shown in FIG. 17. However, it should be appreciated that techniques as described herein are not limited to use in differential signal conductors. In some embodiments, superelastic materials may be used to form conductive elements shaped to carry single-ended signals. Moreover, it should be recognized that techniques as described herein are not limited for use on signal conductors. In some embodiments, superelastic materials may be used to form conductive elements shaped to carry return currents, serve as reference conductors and/or act as shields. Conductive elements used in these ways may be combined to form coax, twinax, triax or other conductive structures. Such conductive elements may form portions of cables or cable assemblies, electrical connectors, and/or other components in an interconnection system.

In the embodiment illustrated in FIGS. 2A and 2B, male portion 202 includes two superelastic wires 204 supported by a housing 216. Female portion 206 includes a housing 218 holding two substantially rigid, conductive receptacles 208. In some embodiments, the housing may be made of any suitable material, and may be insulative. An insulative housing may be formed, for example, by molding a thermoplastic material filled with glass fibers or other suitable material using techniques as are known in the art. However, in some embodiments, portions of the housing may be formed of a lossy material, as described in the co-pending U.S. application Ser. Nos. 14/603,300 and 14/603,294, which are hereby incorporated by reference. The housing also may have any suitable size and may be configured to provide a connector with a desired spacing between conductors. For example, as described above, in some embodiments, the spacing of conductors in a connector array may be between 0.25 mm and 2.5 mm.

The female portion 206 also includes shielding 220 around the housing 218 which may act as a ground conductor. The shielding may be made of any suitable conductive material and may be arranged around any suitable portion of the housing.

Conductive receptacles 208 may be formed of any suitable material, including materials used to form mating contact portions of connectors as is known in the art. Such materials may include copper alloys, such as phosphor bronze. However, in the embodiment illustrated, receptacles 208 are held within housing 218 and do not need to deflect during mating to ensure proper operation. Accordingly, receptacles 208 may be made of materials that are less springy than materials conventionally used to make mating contact portions of an electrical connector. The mating contact portions may be coated with gold or other materials to resist oxidation or otherwise promote good electrical contact between receptacles 208 and superelastic wires 204.

As depicted in FIG. 2A, in the unmated configuration, the wires are substantially straight and undeformed. The receptacles 208 define channels which are bounded by conductive surfaces. The channels have an axis that is parallel with the mating direction of the connectors such that, as the connectors are brought together, superelastic wires 204 will each enter a channel of a receptacle. In the embodiment illustrated, the receptacles 208 are nominally cylindrical and include a plurality of protrusions 210 extending perpendicular to the axis of the channels; in the depicted embodiment the protrusions are arranged on opposing sides of the receptacles and are configured as angled portions.

The receptacles 208 and protrusions 210 together define two tortuous pathways 212 to receive the wires 204. As depicted in FIG. 2B, when mated, the wires 204 contact the protrusions 210 and deform to follow the pathways 212, and therefore make contact with the receptacles 208 at multiple locations, including along the protrusions as well as along the sidewalls of the receptacles. As can be seen, the wires 204 press against the protrusions and are deflected.

Although certain aspects of an interconnection system, have been described above with reference to the embodiment illustrated in FIGS. 2A and 2B, it should be understood that those aspects and other aspects disclosed herein may be applicable to all embodiments described in the present disclosure. Furthermore, different embodiments described herein may be used separately, or may be used in any suitable combination, as the disclosure is not so limited.

Figure 3:
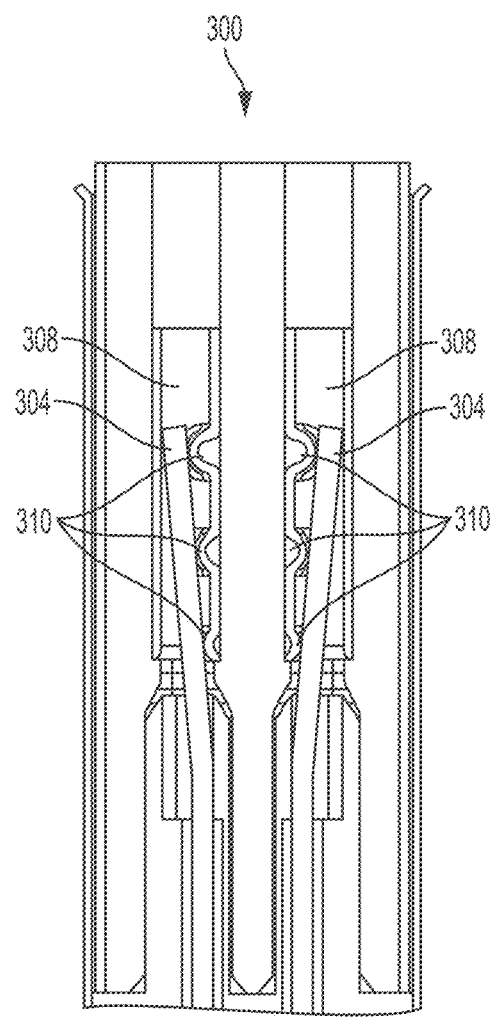
FIG. 3 is a cross-sectional view of another embodiment of a portion of an interconnection system including two superelastic wires and two associated conductive receptacles, in a mated configuration.

FIG. 3 depicts another embodiment of mated connector modules in an interconnection system 300. Similar to the above described embodiment, one of the modules comprises two superelastic wires 304 received in two substantially rigid, conductive receptacles 308 of a mating module. Protrusions 310 are arranged in the passages on a single side, and increase in size along a longitudinal direction of the receptacles. As depicted in FIG. 3, the protrusions are configured to deform the superelastic wires 304 toward the sidewalls of the receptacles 308, such that in the mated configuration, the superelastic wires contact the receptacles at multiple points including at the protrusions 310 and along the sidewalls of the receptacles.

In the above described embodiments, the receptacles are depicted as substantially rigid, and only the component made from the superelastic material (e.g. superelastic wire) may move and/or deform during mating. Alternatively, in some embodiments, a receptacle may include one or more compliant members, such as beams formed from conventional materials which may, or may not, include one or more protrusions. Such compliant members may also deform, but to a smaller extent than the superelastic components such that the deformation of the compliant members does not exceed the elastic limit and therefore the receptacle does not become permanently deformed during mating.

Figure 4A:
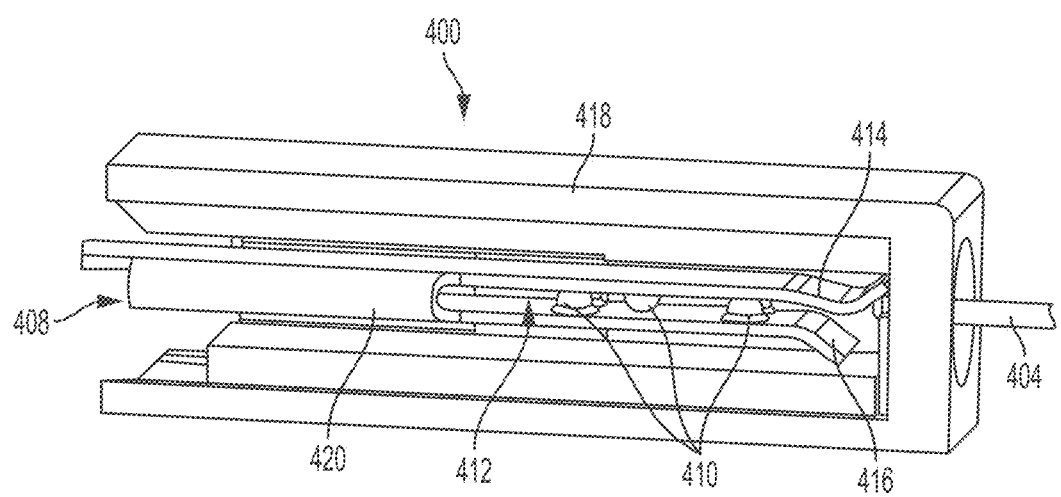
FIG. 4A is a cross-sectional view of yet another embodiment of a portion of an interconnection system including a conductive receptacle having two compliant beams on which a plurality of protrusions are formed, configured to receive a superelastic wire.
Figure 4B:
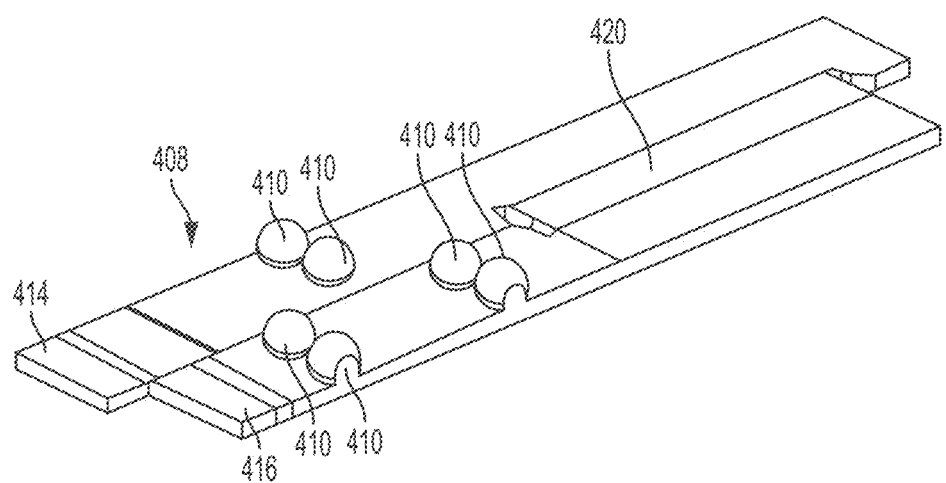
FIG. 4B is an isometric view of the conductive receptacle of FIG. 4A, as manufactured from a single sheet and prior to folding.

FIGS. 4A and 4B depict an illustrative embodiment of a portion of an interconnection system 400 including a housing 418 which holds a conductive receptacle 408. As with the other embodiments illustrated herein, the receptacle may form a portion of a first connector. Multiple like receptacles may be included in the connector. Likewise, the portion of the conductive element illustrated may be a portion of the conductive element. For example, an intermediate portion and a contact tail may be present, though not illustrated. In this example, the receptacle includes two compliant beams 414 and 416 on which a plurality of protrusions 410 is formed. In the depicted embodiment, the receptacle 408 is formed from a single piece which includes a fold 420 such that the compliant beams 414 and 416 form opposing surfaces. Such a form may be formed using known forming processes or in any other suitable way.

During mating, a superelastic wire 404 from a mating connector may be inserted into the receptacle 408. In the embodiment shown, superelastic wire 404 is inserted between the compliant beams 414 and 416 causing the beams to deflect, and therefore generating a contact force between the protrusions 410 and the superelastic wire. As depicted in FIG. 4A, the housing 418 may limit the deformation of the compliant beams during mating to further urge deformation of the superelastic wire 404 and therefore increase the contact force, and also to reduce the possibility of deforming the compliant beams 414 and 416 past their elastic limit. As depicted in FIG. 4B, the receptacle 408 may be manufactured as a single flat sheet, and subsequently folded to form the desired connector geometry. The beams may be formed at an end of an elongated conductive element, with the rest of the conductive element forming an intermediate portion and a contact tail.

Depending on the particular embodiment, protrusions may be arranged in any suitable pattern. In the embodiment illustrated, protrusions have hemispherical upper surfaces and are positioned in pairs. The space between the hemispherical portions may serve as a guide for the wire as it is being inserted. Moreover, it should be appreciated that FIGS. 4A and 4B illustrate a single conductive element. Such a design may be appropriate for a single-ended signal. Alternatively, a mating contact structure as illustrated may be duplicated to provide a pair for carrying a differential signal. In either case, shielding may be positioned around or adjacent to the structure shown.

FIGS. 5A and 5B depict another embodiment of a portion of an interconnection system 500 according to the present disclosure. The portion includes a housing 518 which holds a receptacle 508. As in other embodiments, the housing may be insulative and may include lossy portions. As in the embodiments of FIGS. 2A . . . 4B, the receptacle may include protrusions that deflect an elongated superelastic member inserted into the receptacle. In this example, the receptacle includes a plurality of angled walls 510 extending outward from a back wall 512 of the receptacle, which are constructed and arranged to deflect a superelastic wire 504 during mating.

In the embodiment illustrated, the housing 518 includes projections 530a and 530b arranged in a region 532. The projections may be made from the same insulative and/or lossy materials as the housing 518. Such a configuration may reduce abrupt impedance discontinuities or variations if the connector pieces are not pressed fully together. Specifically, when the wire 504 is inserted into the region 532, it is surrounded at least on one side by an insulator, and therefore the impedance in region 532 may be closer to the nominal impedance of the fully mated connector compared to a configuration in which a segment of the wire 504 was surrounded entirely by air.

The arrows in FIG. 5B are a schematic representation of the tortuous path 514 of the superelastic wire 504 in the mated configuration. Each bend in that tortuous path comprises a deflection point for the superelastic wire. The deflection provides an appropriate contact force to ensure reliable electrical connection. However, those bends have a radius large enough that they do not generate a stress that would exceed the yield stress and cause plastic deformation of the wire. In this way, relatively high forces can be generated while allowing the connectors to mate and unmate reliably over many cycles, because the superelastic wire will return to its original shape when the connectors are unmated.

Figure 5C:
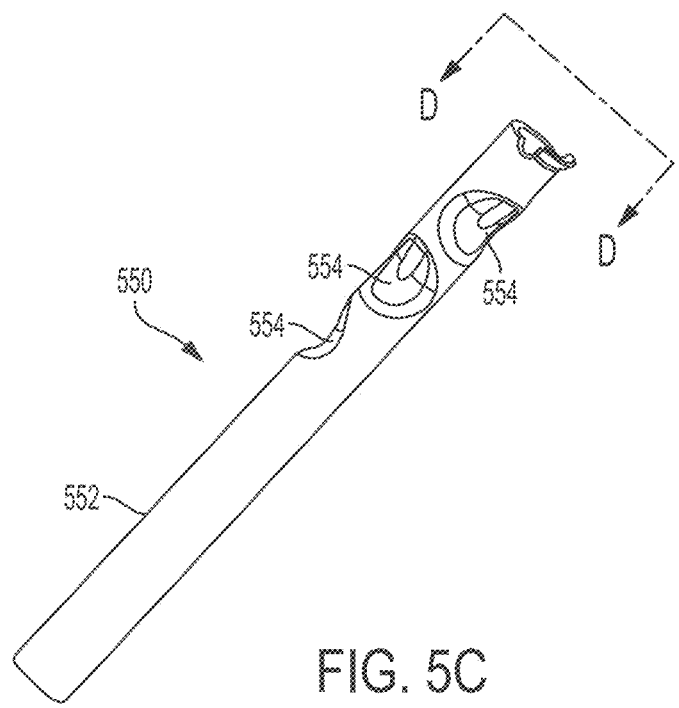
FIG. 5C is an isometric view of an alternative embodiment of a conductive receptacle with protrusions positioned along a helical path to create a helical path for a wire inserted into the receptacle.
Figure 5D:
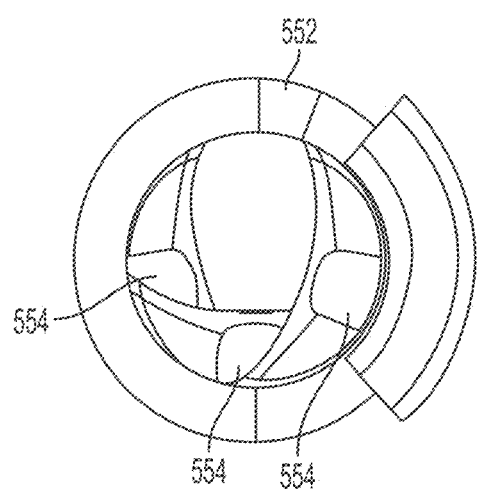
FIG. 5D is an end view of the conductive receptacle of FIG. 5C, taken from the perspective of line D-D in FIG. 5C.
Figure 6:
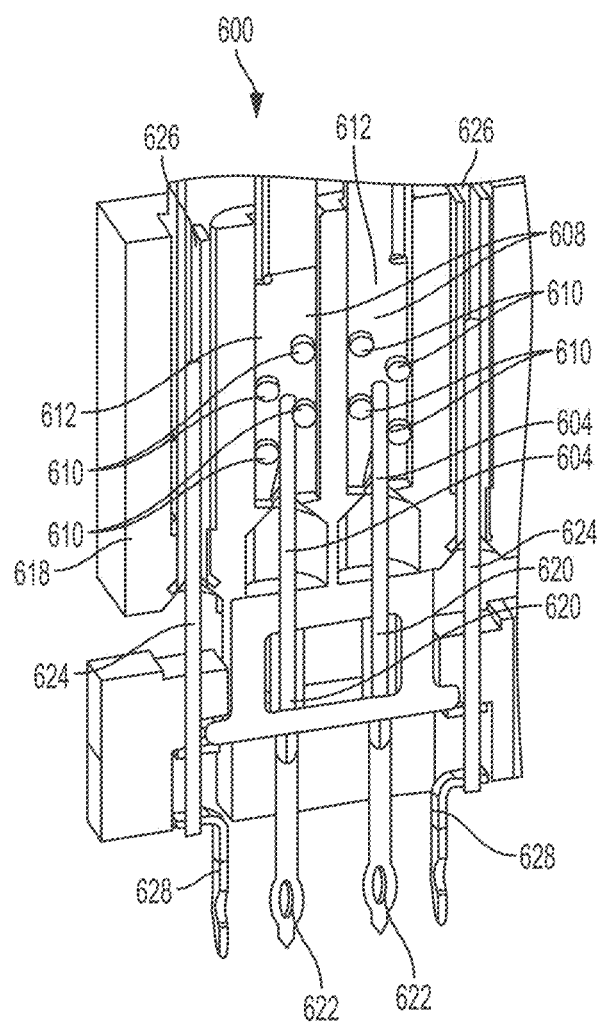
FIG. 6 is a cross-sectional view of yet another embodiment of a portion of an interconnection system including two superelastic wires and two associated receptacles including a plurality of protrusions formed as cylindrical pegs.

FIGS. 5C and 5D depict a further embodiment of a portion of an interconnection system 550 including a conductive receptacle 552; FIG. 5D depicts an end view of the receptacle taken from the perspective of line D-D. As with the other embodiments illustrated herein, the receptacle may form a portion of a first connector. Multiple like receptacles may be included in the connector. Likewise, the portion of the conductive element illustrated may be a portion of the conductive element. For example, an intermediate portion and a contact tail may be present, though not illustrated. In this example, the receptacle includes a plurality of protrusions 554 are distributed along a helical path on the circumference of the receptacle 552 so as to define a helical path for a wire inserted into the receptacle. The protrusions 554 may be distributed along any suitable helical path, including a uniform and/or non-uniform helical path, and may be spaced evenly along the helical path, or alternatively at irregular, as the disclosure is not so limited. Such a configuration may cause a wire, such as a superelastic wire, to twist and/or deform along the helical path as it is inserted into the receptacle, thereby urging the tip of the wire to maintain contact with a side wall of the receptacle over a large range of insertion distances. Such contact with the sidewall of the receptacle may substantially reduce or prevent the formation of stubs, as described in more detail below. FIG. 6 depicts yet another embodiment of a portion of an interconnection system 600. As with other embodiments, the illustrated portion may be just a portion of a module forming a connector. Multiple such modules may be held in a housing or other support structure to form full connectors.

In the depicted embodiment, the receptacles 608 are supported by a housing 618 and include a plurality of protrusions 610 are formed as cylindrical pegs extending from a back wall 612 of the receptacles 608. The space between the pegs may define channels into which a superelastic alloy from a mating connector may be inserted. Similar to the above described embodiments, the protrusions 610 deflect superelastic wires 604 in the mated configuration to generate an appropriate contact force. In this embodiment, intermediate portions 620 of the superelastic wires 604 are attached to contact tails 622. The contact tails also may be made from a superelastic material, or alternatively they be made from a conventional material. The contact tails 622 may enable attachment of a portion of the interconnection system to a printed circuit board or other substrate.

The embodiment depicted in FIG. 6 further includes additional contact elements 624 which may act as ground conductors. The additional contact elements 624 may, or may not, be made from a superelastic material. When mated, contact elements 624 are received by passages 626. Depending on the particular embodiment, contact elements 624 may make contact with passages 626 along sidewalls of the passages; in some instances, the passages 626 may include one or more protrusions or projections arranged to create contact points with the contact elements 624. In the depicted embodiment, contact elements 624 are attached to separate contact tails 628. However, it should be understood that the contact elements 624 and contact tails 628 may alternatively be formed as a single piece in some embodiments, as the disclosure is not so limited. Furthermore, contact elements 624 may be formed as cylindrical wires, flat blades, or any other suitable shape.

In this embodiment, the tip of the superelastic wire is shown to be slightly rounded. In some embodiments, the wire may have a rounded tip or tip of any other suitable shape to provide a tapered surface that may reduce the end of the wire catching on a projection or other structure. The tip, for example, may be angled.

In view of the above described embodiments, it should be understood that a connector which includes one or more protrusions formed in and/or on an associated receptacle and configured to deflect and/or deform a superelastic member, such as a wire, during mating may be constructed and arranged in any suitable manner. For example, the protrusions may have any suitable shape, and may be arranged on opposing sides of a receptacle, on a single side of a receptacle, or in any other suitable arrangement, as the disclosure is not so limited. Accordingly, a superelastic wire may deflect within a receptacle in a single direction, in multiple directions, or in any combination of directions such as in a tortuous path. Furthermore, although superelastic wires are described above, a component made from a superelastic material which deforms in an associated receptacle may have any suitable geometry including, but not limited to, a cylindrical or wire-like geometry, a flat beam or blade-like geometry, or an elongated prism geometry with any suitable cross-sectional shape.

It should also be understood that a connector may include any suitable number of conductive paths comprising superelastic components, such as wires. For example, the embodiments depicted in FIGS. 2, 3 and 6 include two superelastic wires which may be arranged to carry signals as a differential pair. FIGS. 4 and 5 depict connectors which include only one superelastic wire to carry a signal. Additionally, in some embodiments, a connector also may include any suitable number of components made from conventional materials, as the disclosure is not so limited.

Figure 7A:
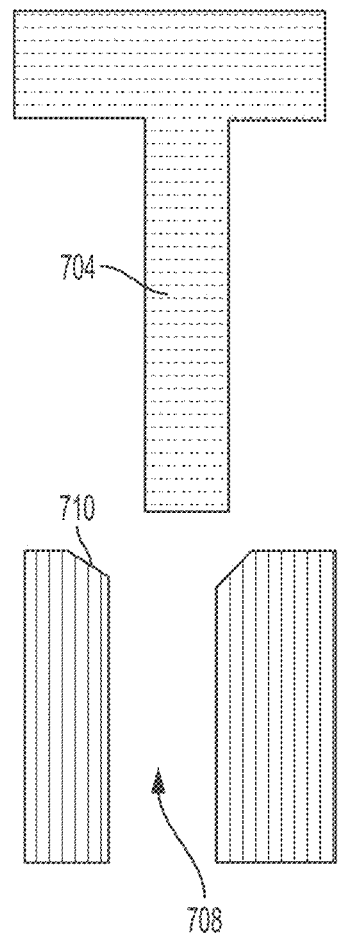
FIGS. 7A and 7B are schematic cross-sectional representations of an embodiment of a portion of an interconnection system including a mating contact which is coaxially misaligned with a conductive receptacle, in an unmated configuration and a mated configuration, respectively.
Figure 7B:
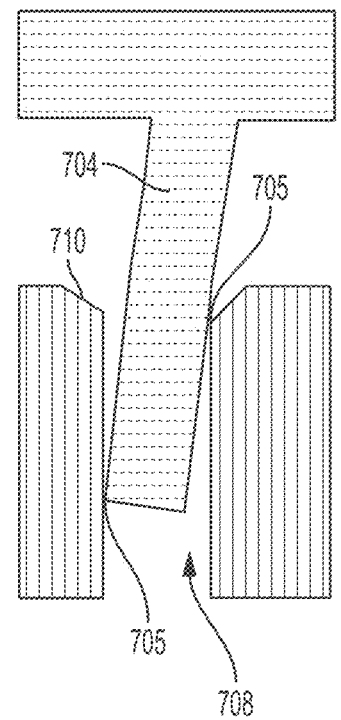

In some embodiments, a mating contact, such as a superelastic wire, may be deformed without any protrusions in a conducting passage. For example, in some embodiments, a mating contact and a conductive receptacle may be arranged in a coaxially misaligned configuration such that the mating contact is deflected by the sidewalls of the receptacle during mating. FIGS. 7A-7B schematically depict an illustrative example of one such embodiment. FIG. 7A shows two connectors in an unmated configuration; as shown in the figure, a wire 704 of a first connector is misaligned with a receptacle 708 of a second connector. The receptacle may be shaped with an opening 710 that is tapered from a larger diameter at the surface of the receptacle to a smaller diameter, which may facilitate insertion of the wire into the receptacle. In some instances, the tapered opening may be formed by countersinking the opening of the receptacle to form a generally conical enlargement of the opening of the receptacle. As discussed in more detail below, the countersink may be coaxially aligned with the opening, or alternatively, the countersink may be coaxially offset relative to the opening.

In some embodiments, the illustrated receptacle 708 may be a mating contact portion of a conductive element in a connector. The wire 704 may be a mating contact portion of a mating connector. However, in other embodiments, the receptacle may be a via 708 formed in a printed circuit board or other substrate. In this embodiment, the wire, rather than forming a mating contact portion of a conductive element in connector, may be a contact tail. Such a structure may likewise be repeated in an array to attach multiple conductive elements within the connector. As depicted in FIG. 7B, when mated, the wire is deflected by the sidewalls of the via such that one or more contact points 705 are formed between the wire and the sidewalls of the via. In particular, the misalignment of the wire relative to the receptacle causes the wire to deform (i.e., elastically and/or plastically) as the connectors are moved towards the mated configuration. In some instances, the connectors may include one or more alignment features (not depicted) arranged to establish and maintain the misalignment between the wire and the receptacle during mating. For example, the alignment features may interact prior to the wire and receptacle moving to the mated configuration, and the positioning of the guides relative to the wire and receptacle may define the misalignment.

Figure 18A:
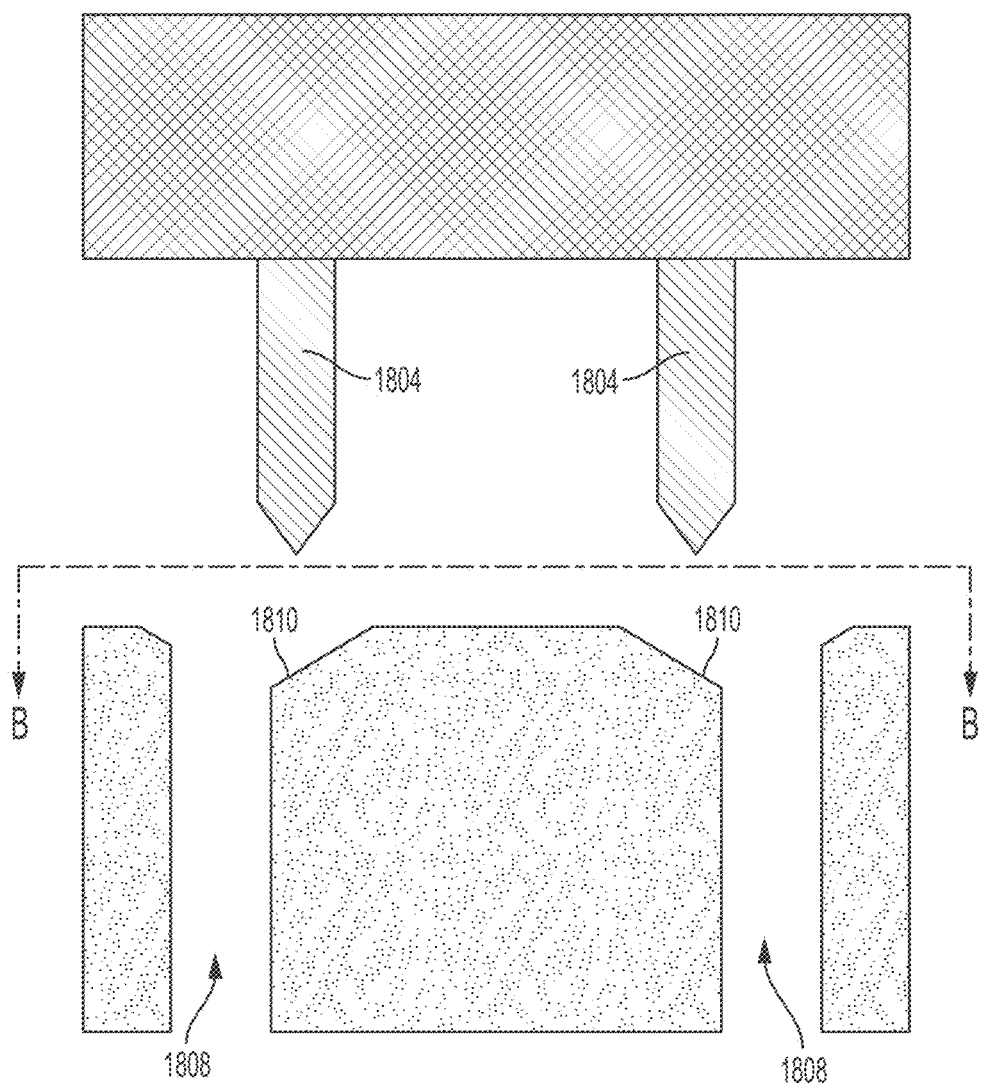
FIG. 18A is a schematic cross-sectional representation of an embodiment of a portion of an interconnection system in an unmated configuration, including two mating contacts which are coaxially misaligned with conductive receptacles.
Figure 18B:
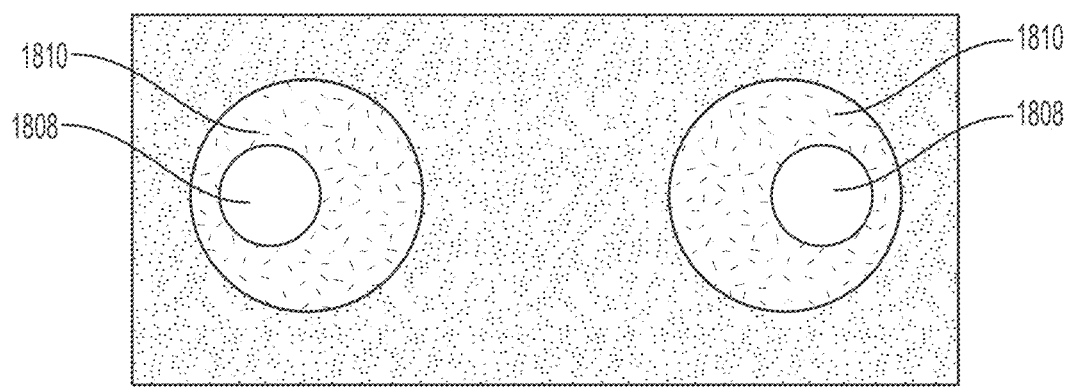
FIG. 18B is a schematic top-view of the conductive receptacles of FIG. 18A, each receptacle having an offset countersink.
Figure 18C:
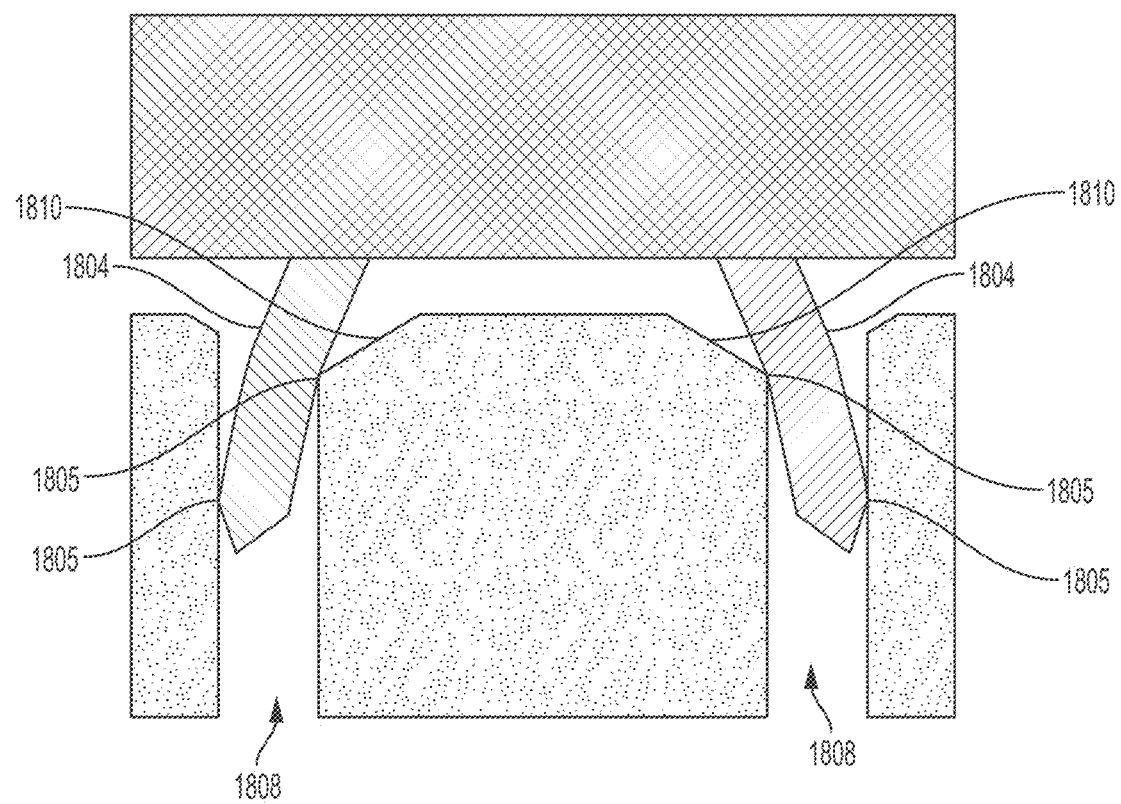
FIG. 18C is a schematic cross-sectional representation of the portion of the interconnection system of FIG. 18A in a mated configuration.

FIGS. 18A-18C schematically depict another illustrative embodiment of a portion of an electrical interconnection system in which one or more mating contacts are deformed without any protrusions in corresponding conducting passages. In particular, FIG. 18A shows the connectors of the interconnection system in an unmated configuration, and FIG. 18C shows the connectors in a mated configuration. In this embodiment, a first connector of the interconnection system includes two mating contacts 1804 that are misaligned with corresponding conducting receptacles 1808 in a second connector. Similar to the embodiment described above with regard to FIGS. 7A-7B, the conducting receptacles may be mating contact portions of a conductive element in a connector, or they may be vias formed in a printed circuit board or other substrate.

In this embodiment, the misalignment is the result of the pair of mating contacts 1804 being more closely spaced than the pair of receptacles 1808. However, misalignment may result from the mating contacts 1804 being more widely spaced than the pair of receptacles 1808. In this example, misalignment is achieved by positioning a plurality of contacts with different spacing than the receptacles into which those contacts are inserted. With this geometry, the set of contacts cannot be positioned so that all contacts of the set align with the receptacles in which they are to be inserted. Alternatively or additionally, misalignment may be achieved in an interconnection system that has alignment features (not shown). As is known in the art, components of an interconnection system may have components for guiding one member of an interconnection system into contact with a mating component of the interconnection system, for example guide pins or chamfered walls of a shell may guide two connectors into a desired relative position. The desired relative position may result in the contacts of one component having their elongated axes being parallel to, but offset from, the axes of the receptacles into which those contacts are to be inserted.

As best illustrated in FIG. 18B, the receptacles 1808 may include countersinks 1810 to provide tapered openings to the receptacles. In this manner, the countersinks may aid in guiding the mating contacts 1804 into the receptacles 1808 when the interconnection system is moved from the unmated configuration to the mated configuration. Further, as illustrated in FIG. 18B, in some instances the countersinks 1810 may be offset relative to the receptacles 1808. In particular, in the depicted embodiment, the receptacles are generally cylindrical, and the countersinks are formed as conical openings in the receptacles with the center of the conical openings offset relative to the centers of the receptacles. Further, the countersinks are offset relative to the receptacles in a direction corresponding to the misalignment of the mating contacts relative to the receptacles. In this manner, relative to a configuration in which the countersinks are aligned with the receptacles, the offset configuration may position more of a tapered surface area where the tapered surface can interact with the mating contacts to aid in guiding the mating contacts into the receptacles. However, it should be understood that the current disclosure is not limited to configurations in which the openings of the conductive receptacles have countersinks that are offset relative to the receptacles.

FIG. 18C shows the interconnection system in a mated configuration. Similar to FIGS. 7A-7B, the coaxially offset configuration of the mating contacts 1804 relative to the receptacles 1808 causes the mating contacts to deform against the sidewalls of the receptacles during mating. In particular, the spacing between the mating contacts is different than the spacing between the receptacles such that the mating contacts undergo deformation as they are received in the receptacles when moving the connectors towards a mated configuration. In this manner, one or more contact points 1805 are formed between the mating contacts and the receptacles to complete the electrical connection. Although the mating contacts 1804 are depicted as having a smaller spacing than the receptacles 1808 in the unmated configuration, thus resulting in the mating contacts deforming outwardly (i.e., away from one another), it should be understood that the disclosure is not limited in this regard. For example, in other embodiments, the receptacles may be misaligned relative to the mating contacts so as to cause the mating contacts to deflect inwardly towards one another (i.e., the mating contacts may have a larger spacing than the receptacles in the unmated configuration).

In some instances, a wire, such as wire 704 in FIGS. 7A-7B or mating contacts 1804 in FIGS. 18A and 18C, may be made from a superelastic material, and therefore the wire may be able to undergo large deformations upon mating, and subsequently recover its original shape upon removing the wire from the receptacle or via 708. However, it should be understood that the current disclosure is not limited to superelastic wires or mating contacts. For example, in some embodiments, the wire 704 or mating contacts 1804 may be made from a compliant material that is operated at stresses that do not exceed the yield stress. In further embodiments, the wire 704 or mating contacts 1804 may undergo at least some permanent deformation (i.e., plastic deformation) upon mating.

The designed misalignment between contacts and receptacles as shown in FIGS. 18A-18C may be employed with other interconnection configurations, including other configurations described herein. Although the receptacles 708 and 1808 in FIGS. 7A-7B and 18A-18C, respectively, are depicted as having generally smooth sidewalls, it should be understood that other configurations also may be suitable, as the current disclosure is not limited in this regard. For example, in some embodiments, the receptacles may include one or more projections extending from the sidewalls and arranged to further deform the mating contacts as the mating contacts are received in the receptacles. In this manner, the projections may aid in forming contact points between the mating contacts and receptacles when the connectors are mated. As a specific example, superelastic wire 504 and receptacle 508 (FIGS. 5A-5D) may be misaligned.

In some embodiments, multiple mating contacts and receptacles may be arranged in an array with each mating contact misaligned with a corresponding receptacle. In some instances, each mating contact is misaligned in the same manner (e.g., along the same direction and/or by the same distance) relative to the corresponding receptacles. Alternatively, multiple pairs of mating contacts and receptacles, such as those depicted in FIGS. 18A-18C, may be arranged to form an array. Accordingly, it should be understood that connectors including misaligned mating contacts and receptacles may be arranged in any suitable configuration.

As a specific example, the misalignment may be applied to all of the signal conductors in an interconnection system. Ground contacts may be made of conventional materials with conventional alignment. Also, it should be appreciated that the misalignment and offset countersink techniques described herein may be used separately or together. Moreover, these techniques may be used with any suitable spacing. However, these techniques may enable small diameter vias in a printed circuit board (forming the receptacles for mounting a connector). As a specific example, the contact may be formed of a wire with a diameter in the range of 0.005-0.010" in some embodiments. In other embodiments, the diameter of the wire may be 0.006-0.008." The drilled diameter of the vias may be less than 0.0157," a diameter conventionally considered small. In some embodiments, the drilled diameter may be in the range of 0.0100-0.0150". In other embodiments, the drilled diameter may be in the range of 0.0120-0.0140" or 0.0110-0.0120" or 0.0100-0.0120". A specific example may be 0.0130".

In some embodiments, the interconnection system may include alignment features that, rather than position the wire off center relative to the receptacle, align the wire with the receptacle. After the wire is inserted into the receptacle, the connector with the wire may be displaced to create a lateral force.

As described above, incorporating superelastic components into electrical connectors may enable designs with improved electrical properties. More specifically, such designs may provide improved signal integrity for high frequency signals, such as frequencies in the GHz range, including up to about 45-50 GHz or higher. One important characteristic of connectors incorporating superelastic components which may enable such designs is the ability to reduce or eliminate stubs in a connector. A stub may be formed if there is an unterminated portion of a mating contact of a connector that extends beyond a contact point. Reflections of signals in stubs can result in interference, leading to significant signal degradation. As shown in FIGS. 2-7, the ability of superelastic components to deform significantly over small distances, i.e. their ability to undergo small radius of curvature deformation without yielding, allows for designs which may shorten or eliminate stubs. For example, as depicted in FIG. 2B, the end 205 of the superelastic wire 204 contacts the conducting sidewall of the receptacle 208 such that no stub results in the mated connection.

Although in the above described embodiments, a superelastic component may be a wire in a male portion of a connector, the inventors have also recognized and appreciated that in some embodiments it also may be beneficial to alternatively or additionally include a component made from a superelastic material in a female, or receiving portion of a connector. For example in some embodiments, a superelastic wire or member of other shape may be included in a receiving portion of a connector constructed and arranged to receive a conventional connector blade. Such embodiments may enable connector designs which provide reliable connections over a range of insertion distances of the connector blade, and may also allow for improved electronic performance by reducing stubs. Furthermore, in some instances, such embodiments may beneficially provide backward compatibility with existing connector components.

Figure 8:
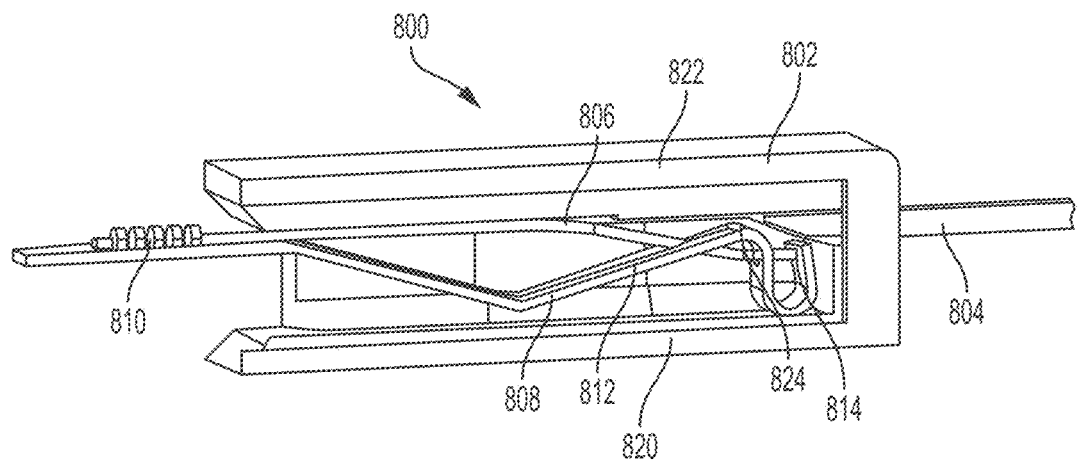
FIGS. 8-10 are cross-sectional views of embodiments of portions of interconnection systems in which a superelastic wire is included in a receiving portion of the connector.

FIG. 8 depicts one illustrative embodiments of a portion of an interconnection system 800 which includes a housing 802 and a superelastic wire 806 in a receiving portion of the connector. As in the above described embodiments, the portion illustrated may represent the mating contact portion of a module. Multiple such modules may be held together in an array to form the mating interface of a connector. Moreover, though not illustrated, the modules may include intermediate portions and contact tails, to enable the connector to be attached to a printed circuit board or other substrate. A member inserted into the module for mating may be a mating contact portion of conductive element in a mating connector. Multiple such conductive elements may be arranged in an array so that the mating contact portions of the two connectors are aligned for mating. The conductive elements of the mating connector may similarly include intermediate portions, which may be held in a housing, and contact tails that extend from the housing for attachment to another component, such as a printed circuit board or cable.

In the embodiment illustrated, some of the conductive elements in the mating connectors may be formed as composites, including portions that are made of a superelastic material and other portions that are made of metal as conventionally used in an interconnection system. Composite elements may provide a desirable combination of mechanical and electrical properties. In the embodiment illustrated the composite conductive element is in the receptacle portion of the connector.

As illustrated, a first end of the superelastic wire is attached to a beam 808 at a first attachment point 810. Here attachment point 810 is implemented with a plurality of bands, integrally formed with beam 808. The bands are bent around superelastic wire 808 and deformed to hold the wire in place. However, it should be appreciated that attachment 810 may be implemented in any suitable way, including soldering, welding or brazing, and may be implemented with straps, rivets or other elements that need not be integral with beam 808.

Beam 808 may be formed of phosphor bronze or other suitable conductive metal and need not be superelastic. The beam 808 features a cutout 812 in a portion of the beam 808 sized to allow a portion of the superelastic wire 806 to pass through the cutout, such that a second end of the wire may attach to the beam at a second attachment point 814. Second attachment point 814 may be formed by inserting wire 806 into holes in beam 808. Here, beam 808 is bent such that there are two holes. The holes may be positioned to be off an axis of wire 806 in its designed shape to provide frictional attachment of wire 806 to beam 808. Soldering, welding, brazing or other suitable attachment techniques may be used instead of or in addition to frictional engagement.

A conventional connector blade 804 may be inserted into an opening of the housing 802 during mating, and the superelastic wire 806 may deform as the blade 804 is moved towards a mated position such that a restoring force in the superelastic wire 806 creates the desired mating force. Here, wire 806 has a length that exceeds the working distance or working range of the interconnection system. The working range, sometimes called "wipe," indicates the range of distances separating two connectors over which electrical connection will still occur, for connectors having the designed nominal dimensions. Having a working range means that mating contact portions of the connectors will be in contact before the connectors are fully pressed together such that the mating contact portions will slide against each other as the connectors are pressed together. Sliding may remove oxides and other contaminants on mating surfaces and promote reliable electrical connection. In addition, a working range allows electrical connection even if one or both to the connectors deviates from the nominal dimensions by less than the working range. For both of these reasons, an interconnection system may be designed with a working range of 2-4 mm. Accordingly, in some embodiments, wire 806 may have a length in this range.

In some embodiments, beam 808 may be separated from housing 802 such that the beam deflects towards the housing when blade 804 is inserted. Such deflection may ensure that superelastic wire 806, which is attached to beam 808, is forced towards blade 804 to ensure sufficient contact force for reliable mating. However, in the embodiment illustrated, beam 808 has a portion contacting a first wall 820 of housing 802 without deflection. Accordingly, beam 808 may not deflect upon mating. Beam 808 may, however, be shaped to deform upon mating such that, as blade 804 is inserted the width of beam 808 may decrease to accommodate for space occupied by blade 804. Such a configuration may accommodate for manufacturing tolerances, while ensure that superelastic wire 806 is forced towards blade 804 to ensure sufficient contact force for reliable mating. In the embodiment illustrated, beam 808 has curves and bends that enable the beam to be compressed.

In the embodiment illustrated, beam 808 has a distal end that is shaped to guide blade 804 into the receptacle without mechanical stubbing. As can be seen in the example of FIG. 8, the portion of beam 808 with which blade 804 first makes contact is curved, with a convexity that guides blades 804 towards a second wall 822 of housing 802 surrounding the receptacle. As can also be seen, the distal end of blade 804 is similarly shaped for this guiding function. In the illustrated embodiment, blade 804 has a tapered tip. Accordingly, blade 804, as it is inserted, will be urged against the second wall 822 of housing 802. In this way, blade 804 will slide between superelastic wire 806 and the second wall, enabling mating force to be generated by deformation of wire 806. Moreover, the distal end of beam 808 may be configured to provide a contact point 824 on beam 808. That configuration provides only a very small stub on blade 804, improving electrical performance of the interconnection system, particularly at high frequencies.

As depicted in FIG. 8, the connector is configured such that the superelastic wire 806 includes a bend when the connector is in the unmated configuration and is therefore preloaded; such preloading may provide an enhanced restoring force in the wire, leading to a larger mating force, which in turn may provide a more robust and/or reliable contact. Furthermore, as described above the high elastic limit and associated deformability of the superelastic wire 806 may enable the wire to deform to conform to blade 804. The mating connectors may be configured such that the tip of blade 804 does not extend into the receptacle beyond wire 806. As a result, wire 806 will be in contact with blade 804 at least at the end of the blade 804 when mated. As a result of this configuration, the stub length (the length of the portion of the blade which extends beyond the contact point) is reduced compared to conventional connector designs.

Figure 9:
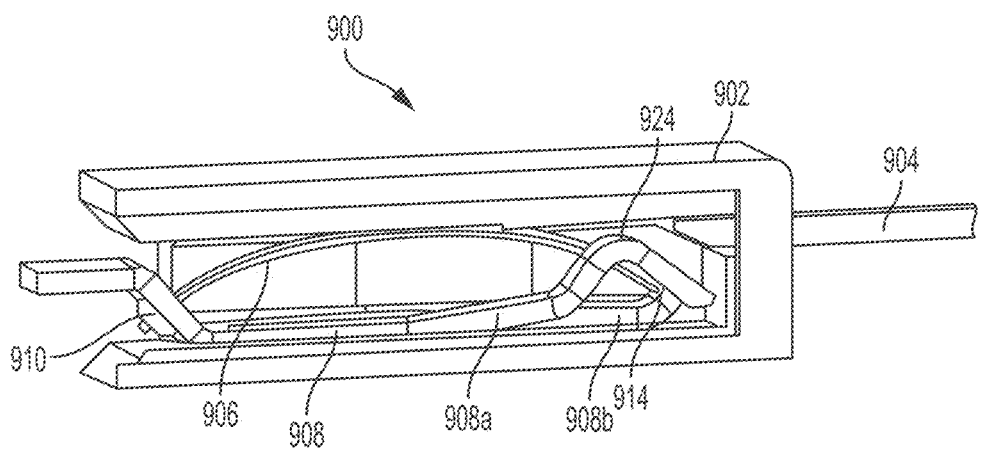

FIG. 9 depicts another illustrative embodiment of an interconnection system 900, formed by two mating connectors, only portions of which are illustrated. Similar to the embodiment depicted in FIG. 8, one connector includes a superelastic wire 906 and a beam 908 in a housing 902 forming a receiving portion of a receptacle, adapted to receive a blade 904 from a mating connector. The illustrated configuration similarly ensures contact at the tip of blade 904 and near the distal end of beam 908, providing low stub lengths.

In the embodiment of FIG. 9, a first end of the superelastic wire is connected to beam 908 at a first attachment point 910. Attachment point 910 may be implemented in any suitable way, such as a hole in beam 908 into which wire 906 is inserted and then secured in place. Such an attachment may be achieved by soldering, by deforming the metal of beam 908, or in any other suitable way. The beam 908 includes a first arm 908a and a second arm 908b. The first arm 908a includes a bend to form a contact point 924, and the second arm 908b includes a second attachment point 914 to connect to a second end of the superelastic wire 906. Second attachment point may similarly be formed in any suitable way, including by insertion of wire 906 into a hole in the beam. As depicted in FIG. 9, the superelastic wire 906 is preloaded (bent) to provide an enhanced contact force during mating. When the blade 904 is inserted into the connector, the blade may contact both the contact point 924 on the first arm 908a and the superelastic wire 906 to form an electrical connection with at least two contact points.

Figure 10:
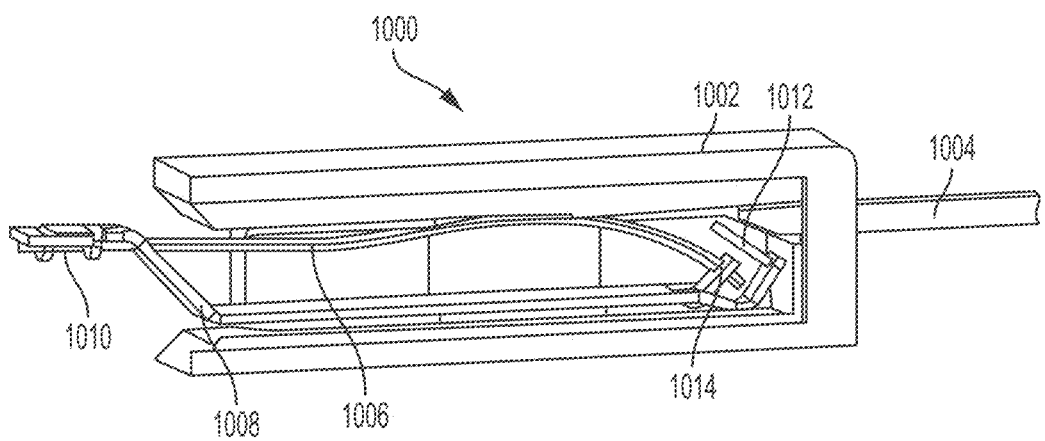

FIG. 10 depicts yet another embodiment of an interconnection system 1000, similar to those depicted in FIGS. 8-9. The connector includes a superelastic wire 1006 and a beam 1008 in a housing 1002 which is adapted to receive a connector blade 1004. A first end of the superelastic wire 1006 is attached to beam 1008 at a first attachment point 1010. Attachment point 1010 may be formed using any of the techniques described above for attachment points 810 or 910 or in any other suitable way.

The beam 1008 may be formed at one end to include a tab extending upwards from the surface of the beam. The tab may include a hole through it. A second end of the superelastic wire 1006 attaches to the tab on the beam at a second attachment point 1014 Attachment point 1014 may be formed in any suitable way, including using a technique as described above for attachment points 814 and 914.

The distal end of beam 1006 may similarly include a contact point for providing a short stub length on beam 1006. In the illustrated embodiment, the contact point is provided by a member projecting from beam 1008. In the embodiment illustrated, that member is a wire segment 1012. Wire segment 1012 may, in some embodiments similarly be formed of superelastic wire. However, in some embodiments, the member may be formed using any suitable conductive structure. During mating the wire segment 1012 and the superelastic wire 1006 contact the blade 1004 at different contact points, such that a reliable electrical connection is formed, with short stubs that provide desirable high frequency performance. It should be understood that in the embodiments described with reference to FIGS. 8-10, the strains introduced in the superelastic wires 806, 906, and 1006 during mating may exceed the elastic limit of conventional materials, and therefore the large elastic limit of superelastic materials enables such designs. It should also be understood that other components of the connectors may be made from superelastic materials in addition to the superelastic wires. For example, any portion of the beams 808, 908, and 1008, the wire segment 1012, the blades 804, 904, and 1004, or any other suitable portion of the connector may be made from superelastic materials, as the disclosure is not so limited.

Depending on the particular embodiment, a superelastic component such as a wire, pin, blade, beam, etc. may have any suitable size. For example, in certain embodiments, a superelastic wire may have a diameter of about 0.125 mm, about 0.177 mm, about 0.25 mm, or between about 0.08 mm and about 0.3 mm. However, it should be appreciated, that when the superelastic wire is intended to form a portion of a power contact, the wire may have a larger diameter. In some embodiments, a superelastic wire may have a length between about 2 mm to 20 mm. However it should be understood that other sizes and/or geometries are also possible, as the disclosure is not so limited. In some embodiments, the wire may be even smaller than sizes indicated herein, such as a standard size regarded as ultra small. Such wires may have orders less than 0.08 mm, such as on the order of 1 mil.

According to another aspect of the present disclosure, the incorporation of superelastic materials into separable electrical connectors may enable miniaturization of connector designs such that the overall density of connections in an electrical connector may be increased. The signal density of a connector is herein defined as the number of conductive elements designed to carry a signal per unit length along a particular dimension of an electrical connector. For backplane connectors, that dimension is typically measured parallel to the edge of a daughter card plugged into the backplane. In some embodiments, the signal density of a connector may be increased by reducing a characteristic size (e.g. cross-sectional area) of various components of the connectors; however, such a reduction in size may make the components more susceptible to damage. For example, as the cross-sectional area of a wire used in the mating interface of a connector is reduced, any deformation of the wire (e.g. from force caused by misalignment during mating) may lead to large local strains which may cause permanent deformation.

In some embodiments, a single wire which becomes permanently deformed may substantially destroy an entire connector and/or require complicated and costly repairs of an interconnection system containing the damaged connector. However, the high elastic limit of superelastic materials may allow for such miniaturization while significantly reducing the chance of damage to a connector from inadvertent application of force to various components. In particular, the deformability of superelastic materials may allow for higher density connector designs which maintain a desired level of robustness.

Figure 11A:
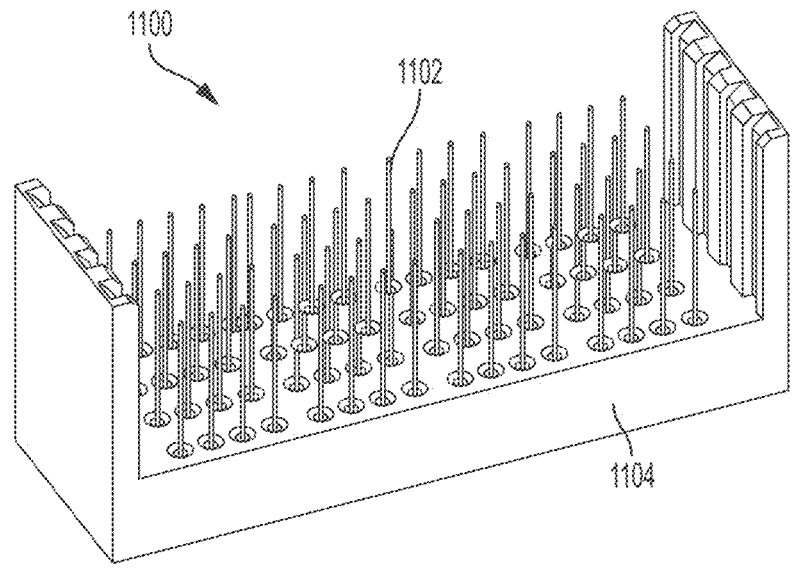
FIG. 11A is an isometric view of a connector including a plurality of superelastic pins.
Figure 11B:
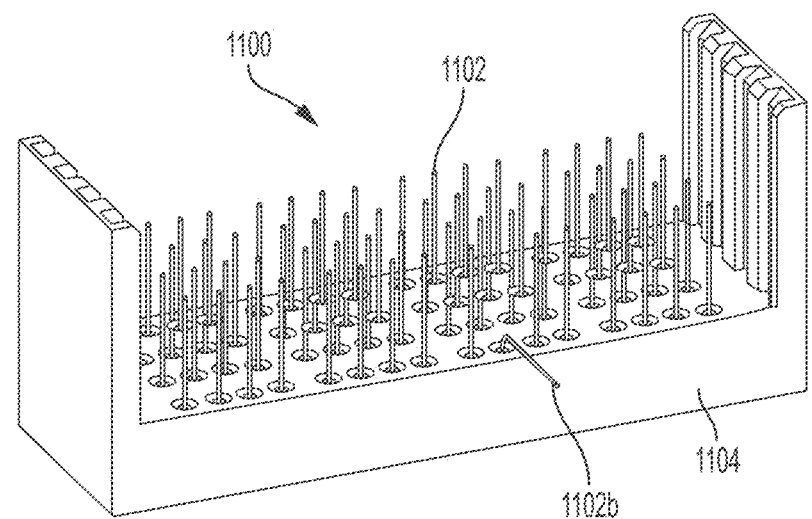
FIG. 11B shows the connector of FIG. 11A with a bent pin.

FIG. 11A shows an illustrative embodiment of a connector 1100 with a plurality of pins 1102 supported in a housing 1104. As described above, the pins may feature a smaller cross sectional area than conventional connectors made from conventional materials in order to achieve a higher density of signal conductors. FIG. 11B depicts an embodiment in which one of the pins 1102b has become deformed, (e.g. due to a misapplied force during mating). If made from a conventional material, the pin 1102b may be permanently deformed and the connector may be unusable. However, a pin 1102b made from a superelastic material may be able to undergo the deformation depicted in FIG. 11B without yielding, and subsequently return to the undeformed state shown in FIG. 11A.

Figure 11C:
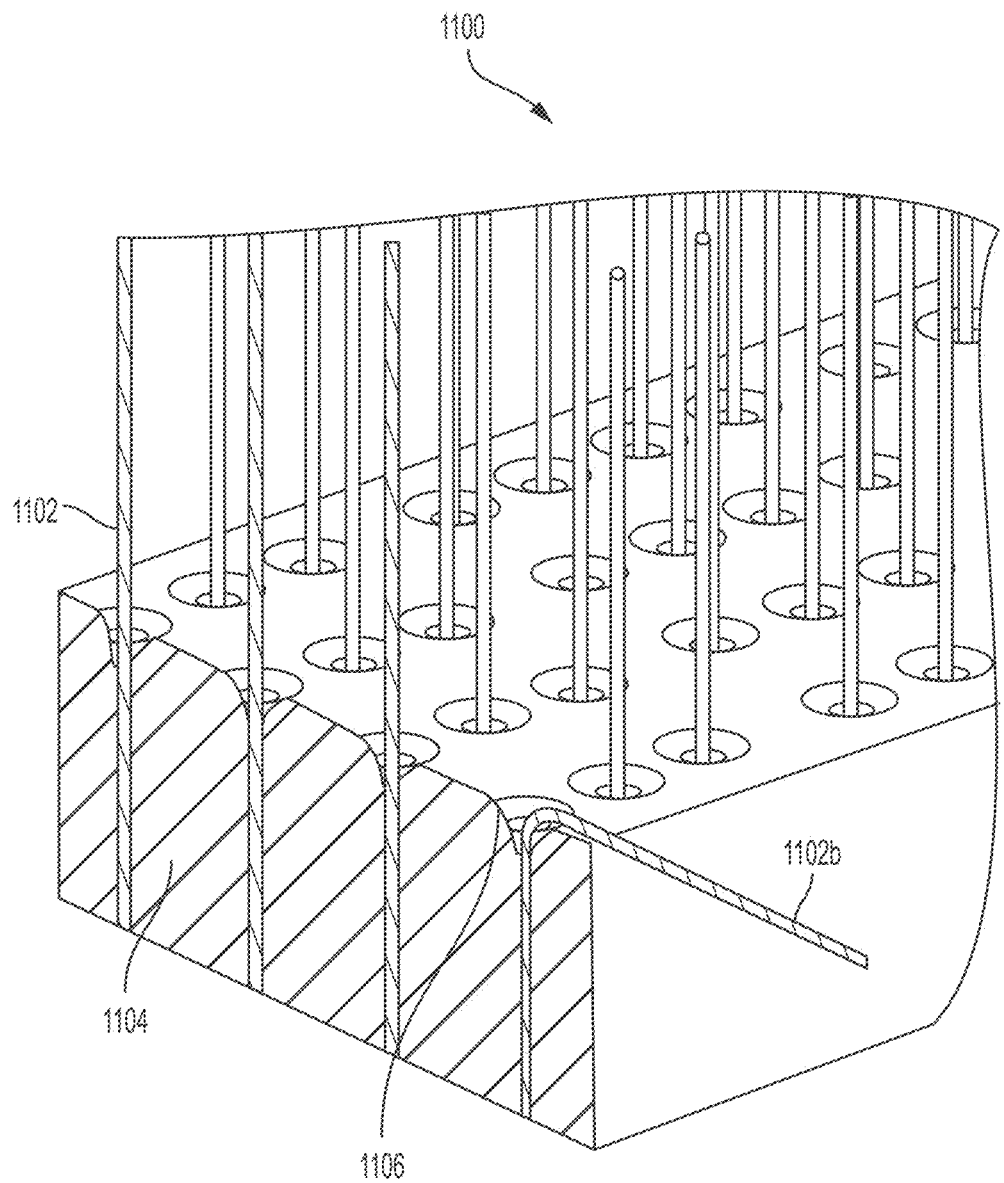
FIG. 11C shows a cross-sectional view of the connector of FIG. 11B.

In some embodiments, the housing of a connector may further include relief features to reduce the extent of local deformation such that a connector may be less susceptible to permanent deformation and damage resulting from inadvertently bent wires. A relief element may guide a bent over pin through an arc that provides a larger radius of curvature, and therefore less stress, than a similar pin bent over a sharp edge of a housing. For example, FIG. 11C is an enlarged cross-sectional view of the connector depicted in FIGS. 11A and 11B; as depicted in FIG. 11C, the housing 1104 includes a relief element 1106 for each pin 1102 in the connector 1100. The relief elements 1106 are formed as tapered conical portions in the housing 1104 at the locations where the pins 1102 exit the housing. As illustrated by the bent pin 1102b, the tapered portion results in an increased radius of curvature of the pin if it is inadvertently bent, compared to a design featuring a sharp corner, and thus reduces the local strain experienced by the pin Such a reduction in local strain may be sufficient to prevent yielding of the pin and associated permanent damage to the connector. For example, the tapered portion may be configured such that pins 1102 may be deformed to a minimum radius of curvature of about 1.5 times the diameter of the pins. A superelastic material may undergo such a deformation without yielding, whereas a conventional material would yield and become permanently deformed.

In one non-limiting example, the conductors in a connector may be pins made from a superelastic wire having a diameter of about 0.25 mm. As described above, the connector may be configured with the pins arranged in a two-dimensional array. For example, a 24.6 mm by 21.5 mm array may include 12 rows, with each row having 6 pairs of pins forming 72 differential signal pairs; each pair may have a signal to signal spacing of about 0.65 mm. Such an arrangement may provide a connector with about 13.6 signal pairs per square centimeter. It should be understood that the superelastic material may enable sufficient mechanical robustness for the 0.25 mm diameter pins such that the connector may be repeatedly mated and unmated without damaging the pins.

In contrast, a conventional connector design including conductive elements made from conventional alloys may require larger components and/or additional structural features to guarantee a similarly suitable degree of mechanical robustness. For example, conventional materials may not be reliably used in the form of small diameter wires or pins, and therefore are often provided as wider blades. Furthermore, larger ground conductors having stiffening ribs may also be required to protect the signal conductors. In one example, a conventional connector with conductive elements made from conventional materials may have an overall size which is similar to the connector described above, but the larger size of the conductors may limit the density of the connector. For example, the conductors may be arranged in a 24.6 mm by 22.5 mm array with 12 rows of 4 pairs of signal conductors, each pair having a signal to signal spacing of about 1.65 mm. Such a connector may provide a signal density of about 8.7 signal pairs per square centimeter. In this example, the use of superelastic conductors enables a connector with a signal density which is over 55% greater than a connector utilizing conventional materials. However, it should be understood that other suitable sizes and/or configurations of superelastic conductors may be used which may provide larger increases in signal density.

According to another aspect of the present disclosure, in some embodiments, only a portion of a conductive element may include superelastic materials. For example, portions which may experience large deformations may be made from superelastic materials, while other portions which may not be subjected to large deformations may be made from conventional materials. Alternatively, in some embodiments, conductive elements made from superelastic materials may be used as spring elements to provide a desired mating force between connector components made from conventional connector materials. The inventors have recognized and appreciated that embodiments in which only a portion of an electrical connector is made from a superelastic material may be beneficial to provide a connector with improved electronic properties. More specifically, many superelastic materials have lower electrical conductivities than conventional materials used in electrical connectors, and thus limiting the use of superelastic materials may improve the overall conductivity of a connector. Furthermore, many superelastic materials may be more expensive than conventional materials for electrical connectors; therefore, the cost of connectors may be reduced by limiting the use of superelastic materials to the portions of the connectors in which the mechanical properties of the superelastic materials may be beneficial.

Figure 12:
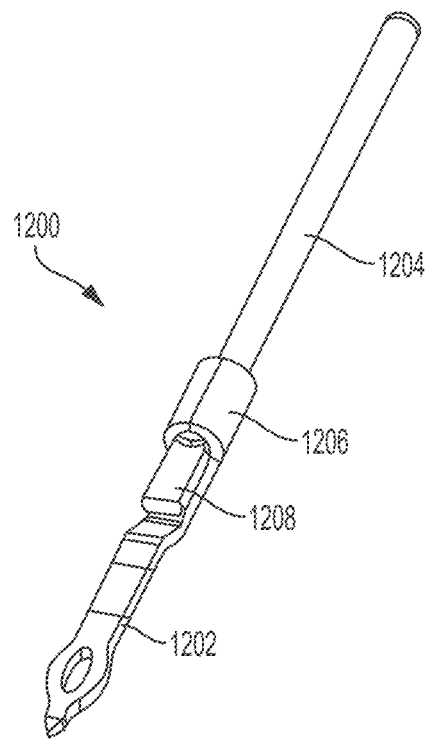
FIG. 12 is an isometric view of an embodiment of portion of a connector including a superelastic portion attached to a portion made from a conventional material.

Accordingly, in some embodiments, a superelastic portion may be attached and/or coupled to a portion of a connector made from a conventional material at or near the mating interface of a connector. Depending on the particular embodiment, the superelastic portion may be attached to a conventional material by stamping, welding, riveting, or any other suitable process of attaching, as the disclosure is not so limited. For example, FIG. 12 depicts an illustrative embodiment of a portion of a conductive element 1200 including a first portion 1202 made from a conventional material, and a superelastic portion 1204. In the depicted embodiment, the superelastic portion is a wire which may deform during mating, as described above with reference to FIGS. 2-7. The wire forms the mating contact portion of the connector. Portion 1202 forms a contact tail, here illustrated as an eye-of-the-needle press fit contact tail. The intermediate portion may be formed of the superelastic material and/or the conventional material. The first portion 1202 is stamped with tabs that may be formed into a collar 1206 around the superelastic portion 1204 such that the conventional material and superelastic material are mechanically and electrically coupled. The mechanical coupling may be achieved based on the pressure of the collar against the superelastic material, or may be formed using soldering, welding or other attachment techniques. In the embodiment depicted in FIG. 12, the superelastic portion 1204 includes an end portion 1208 which is permanently deformed to be wider than an opening of the collar 1206. Such a permanently deformed end portion may improve the mechanical and/or electrical coupling between the conventional material and the superelastic material, and may help to prevent the superelastic portion from sliding out of the collar. However, it should be understood that in some embodiments, a permanently deformed portion may have any suitable shape and may be disposed at any suitable location along a superelastic portion, including away from an end of the superelastic portion. Moreover, it should be understood that a permanently deformed portion may not be included in some embodiments, as the disclosure is not so limited.

Figure 13A:
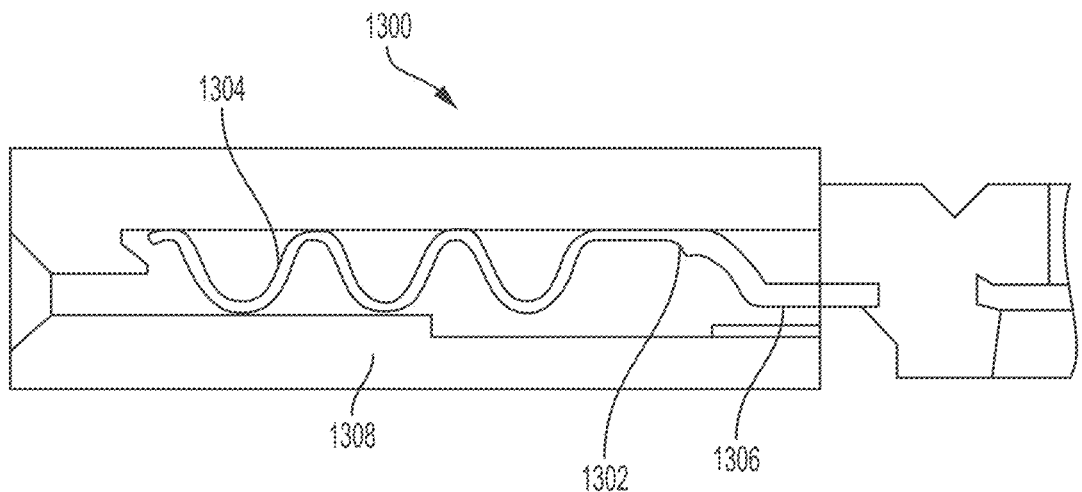
FIGS. 13A and 13B are cross-sectional views of one embodiment of a connector including a superelastic portion formed into the shape of a wave, in the unmated and mated configurations, respectively.
Figure 13B:
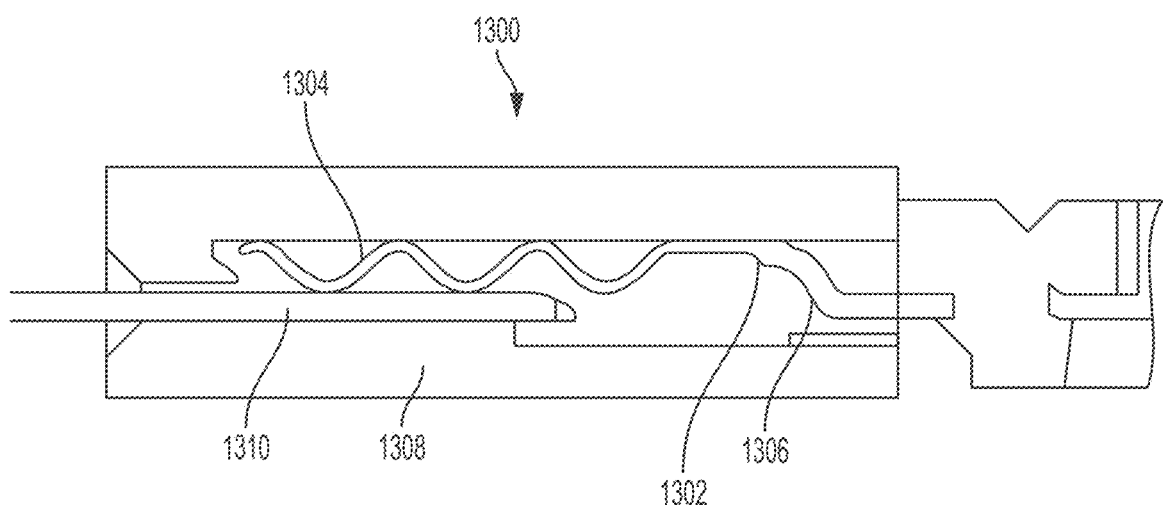

FIGS. 13A and 13B depict another embodiment of a connector 1300 including a contact element 1302 which includes a superelastic portion 1304 forming the mating contact portion of a conductive element and a second portion 1306. The superelastic portion 1304 is formed in the shape of a wave and is joined (e.g. welded) to a second portion 1306 made from a conventional material. The superelastic portion 1304 is disposed in a housing 1308 adapted to receive a conventional connector blade 1310. As depicted in FIG. 13B, when a blade 1310 is inserted, the superelastic portion 1304 is compressed between the housing 1308 and the blade 1310 to generate the required mating force. The wave shape of the superelastic portion 1304 is flattened when compressed.

Figure 14A:
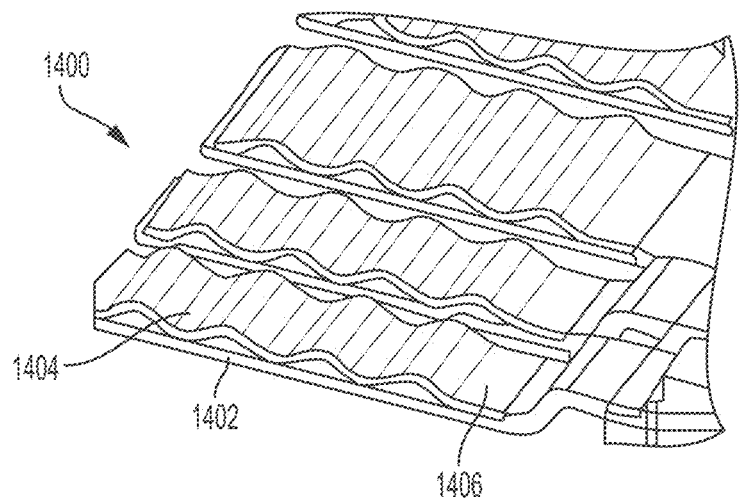
FIG. 14A is an isometric view of one embodiment of a mating contact portion of a conductive element in which a superelastic portion is welded to a backing plate.
Figure 14B:
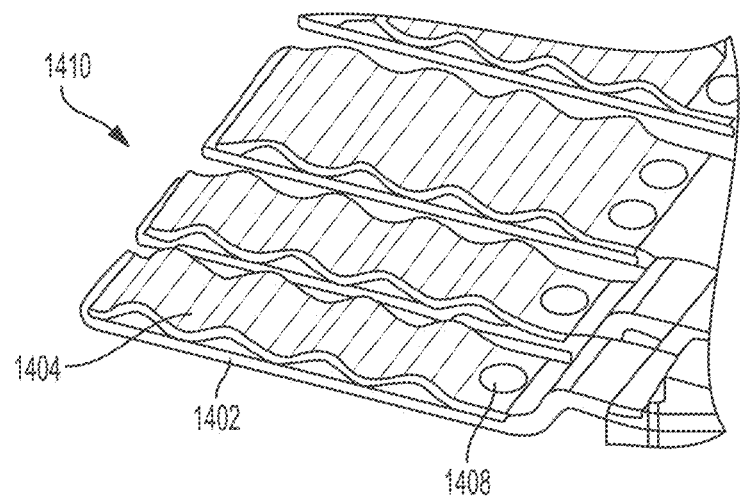
FIG. 14B is an isometric view of another embodiment of a mating contact portion of a conductive element in which a superelastic portion is riveted to a backing plate.

FIGS. 14A and 14B depict two additional embodiments of mating contact portions 1400 and 1410 of conductive elements, including a superelastic portion 1404 attached to a backing plate 1402 formed from a conventional material. In the embodiment shown in FIG. 14A, the superelastic portion 1404 is connected to the backing plate by a weld 1406, while in the embodiment shown in FIG. 14B, the superelastic portion 1404 is attached by a rivet 1408.

Figure 14C:
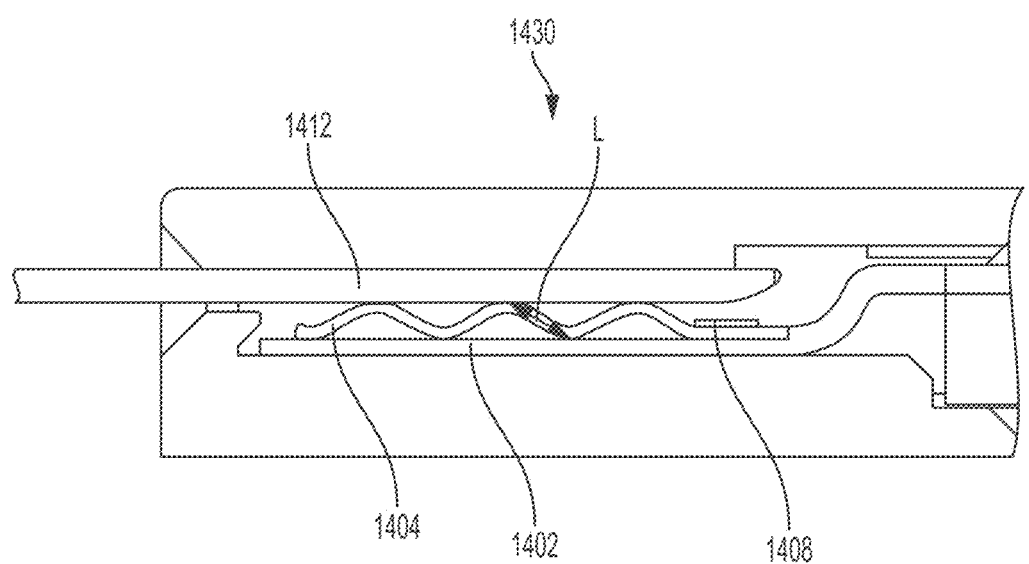
FIG. 14C is a cross-sectional view of a portion of an interconnection system including the mating contact portion of FIG. 14B in a mated configuration.

FIG. 14C depicts a cross-sectional side view of a portion of an interconnection system 1430 incorporating the mating contact portion 1410 of FIG. 14B in a mated configuration. Similar to the embodiment described above with reference to FIG. 13B, when mated, the wave shape of the superelastic portion 1404 is compressed and flattened to generate a contact force between a connector blade 1412 and the backing plate 1402. Compared to the embodiment depicted in FIG. 12, the backing plate in the embodiments depicted in FIGS. 14A-14B may provide a shorter conduction path through the superelastic material between portions made from conventional materials. For example, as depicted in FIG. 14C, a conduction path L is formed between the blade 1412 and the backing plate 1402; the length of path L may be substantially shorter than the overall length of the superelastic portion 1404. As described above, many superelastic materials have an electrical conductivity that is less than the conductivity of conventional materials, and therefore a shorter conduction path through the superelastic material may provide improved electronic performance.

It should be understood that although in the above described embodiments a superelastic portion is attached to a portion made from a conventional material, in some embodiments, the superelastic portion may not be attached to a conventional material, as the disclosure is not so limited. For example, the superelastic portion may be provided as a standalone insert configured as a spring element to provide a desired mating force within a connector. Furthermore, although the superelastic portion is depicted as being provided between portions made from conventional materials (i.e. conventional connector blades), in some embodiments, a superelastic insert may be provided outside of the interface of two connector blades, and may be configured as a simple spring element to provide a contact force between the two blades.

Composite conductive elements, including superelastic portions and conventional metals, such as phosphor bronze, may be formed in other ways. For example, segments along the length of a conductive element may be formed of different materials. The segments may be fused by welding, brazing or in any suitable way. Segments that bend, or bend to create a stress above a predetermined level may be formed of superelastic materials while other portions may be formed of conventional materials.

As an example of another technique that may be used to form a composite conductive element, a superelastic member may serve as a structural support for the conductive element. That support may be coated with a conductive material over all or portion of its length. For example, conductive elements are often coated with gold, and such material may be used. In contrast to conventional gold coatings that are frequently localized to a contact point, the conductive coating may extend outside of the contact region and may cover large portions of the length of the conductive element, such as greater than 25%, 35%, 45%, 55%, 65%, 75%, 85%, or 95% up to 100% of the length of the conductive element, in some embodiments.

Figure 15:
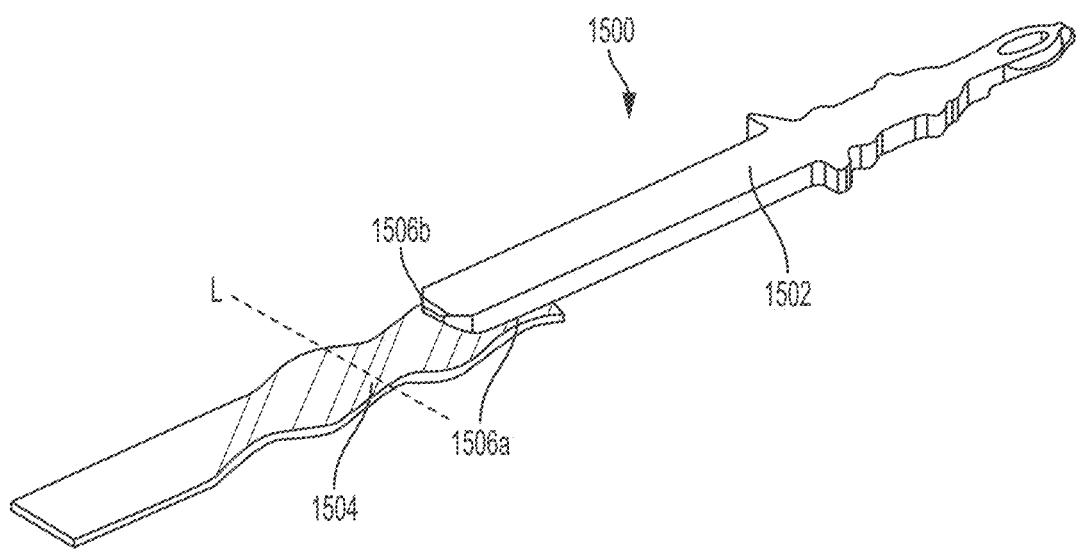
FIG. 15 is an isometric view of yet another embodiment of a contact element of an interconnection system in which a superelastic portion has an angled wave shape.

Although a simple wave shape is depicted in the above described embodiments, other geometries also may be used. For example, FIG. 15 depicts an embodiment of contact elements 1500 of connector including a superelastic portion 1504 with an "angled wave" geometry. During mating, a conventional connector blade 1502 may contact the angled wave at multiple contact points 1506a and 1506b along the superelastic portion. Depending on the particular embodiment, a wave geometry, angled wave geometry, or any other suitable geometry for generating a mating force within a connector may be formed by any suitable method, including, but not limited to, standard stamping methods, coining, heat treatment methods, or any suitable combination of methods.

In the embodiment illustrated, the angled waves are angled relative to the width of the contact element such that a line perpendicular to the elongated dimension of the contact element, at any point within the mating region will contact at least one of the waves. For example, line L, near the proximal end of one wave is contacting the distal end of an adjacent wave. Such a configuration facilitates mating without forming electrical stubs. With this configuration, a tip of a mating blade will be terminated regardless of where, over its working range, it makes contact with the wavy contact element.

According to another aspect of the present disclosure, the high elastic limit of superelastic materials also may enable designs which provide a substantially constant impedance between conductors in a differential pair, and thus reduce impedance variations and reflections in the connector and improve signal integrity. The impedance between a pair of conductors depends both on the spacing between the conductors as well as the dielectric constant of the material between the conductors. Therefore, to provide a constant impedance, the spacing between the conductors may be varied when the conductors transition between environments with different dielectric constants.

For example, a mating contact shaped as a receptacle may have a larger external dimension that a mating contact inserted into the receptacle. To maintain the same edge to edge spacing between the receptacle contacts as exists for the mating contacts, the center to center separation of the receptacles may be greater than the center to center spacing of the mating contacts outside of the receptacle. As a result, the center to center spacing of the mating contact inserted into the receptacle needs to change when inserted in the receptacle and when not. In the example of FIGS. 2A and 2B, the mating contacts are formed of wires 204, and the change of separation, and the need for bending of those wires, can be seen by a comparison of FIGS. 2A and 2B.

As another example, in one embodiment, the conductors in an electrical connector may be separated by an air gap when in an unmated configuration. In the mated configuration, the conductors may be separated by a housing material which has a higher dielectric constant than air. In such an embodiment, the spacing between the conductors may be increased by deforming the conductors in order to maintain a constant impedance. Such an embodiment may be advantageous as it may provide a connector which may be less susceptible to the above described effects of impedance changes which may result from incomplete mating. Specifically, if a connector is inadvertently incompletely mated, a first portion of the conductors forming a differential pair may not be fully received in the housing, and thus the conductors may be separated by an air gap. A second portion of the conductors may be received in the housing and be separated by the housing material (e.g. plastic) with a higher dielectric constant than air. By increasing the spacing between the conductors in the housing, the impedance of the conductors may be maintained at a substantially constant value even in an incompletely mated configuration, and undesirable reflections and/or noise from impedance changes may be reduced and/or minimized. Therefore, such embodiments may provide a larger tolerance to incomplete and/or partial mating compared to connector designs which do not include such impedance matching designs.

Importantly, in order to reduce the above described negative effects associated with changing impedances, the change in separation between conductors must occur over a small distance, resulting in relatively large local deformations with small radii of curvature. Such deformations are not possible using conventional materials without yielding and associated permanent deformation. However, the high elastic limit and associated deformability of superelastic materials may enable such deformation to be reliably and repeatedly applied to the conductors without yielding.

An illustrative embodiment of a connector including the above described impedance matching feature is described with reference to FIGS. 2A and 2B. In the unmated configuration depicted in FIG. 2A, the superelastic wires 204 have a first separation 51 which is less than a second separation S2 which the wires have in the mated configuration, as depicted in FIG. 2B. Having different separations between conductive elements that form a differential pair may be useful in tailoring the impedance along the length of a signal path through an interconnection system. This increase in separation between the conductors may offset a corresponding increase in dielectric constant between an air gap in the unmated configuration to the gap comprising a housing material (e.g. plastic) in the mated configuration, thereby providing a more uniform impedance. Similar approaches of providing, upon mating, lateral bending of a portion of a conductive element may aid in tailoring electrical properties like impedance or cross talk. For example, in some embodiments, spacing between two signal conductors may be decreased, or increased as shown in FIG. 2B.

In other embodiments, spacing between signal conductors and an adjacent shield or ground conductor may be increased or decreased. In this context, lateral motion implies motion perpendicular to the insertion direction of the connectors. Using superelastic members for portions undergoing lateral motion, instead of conventional materials, allows a wider range of lateral motion and reduces the risk of damage to the interconnection system.

Figure 16A:
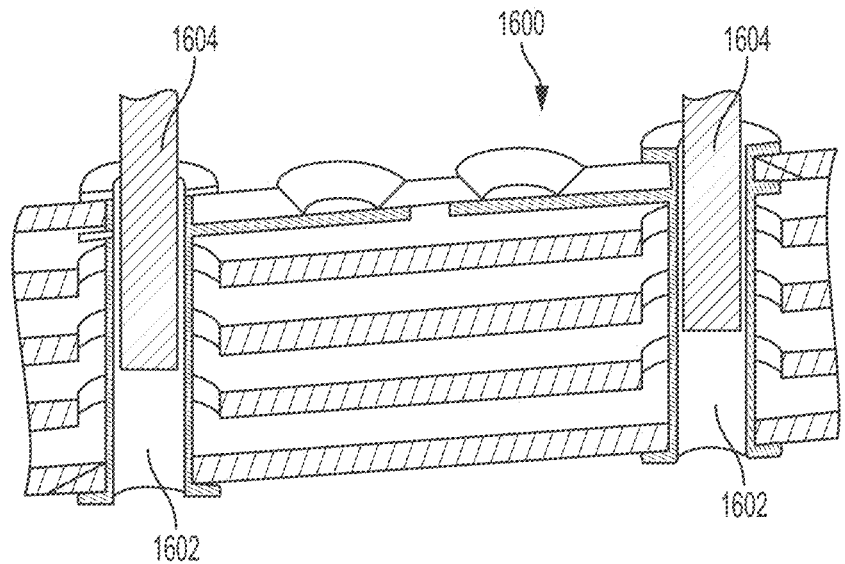
FIG. 16A is a cross-sectional view of an embodiment of a portion of an interconnection system including two shape memory wires below a critical transition temperature, in a partially mated configuration.
Figure 16B:
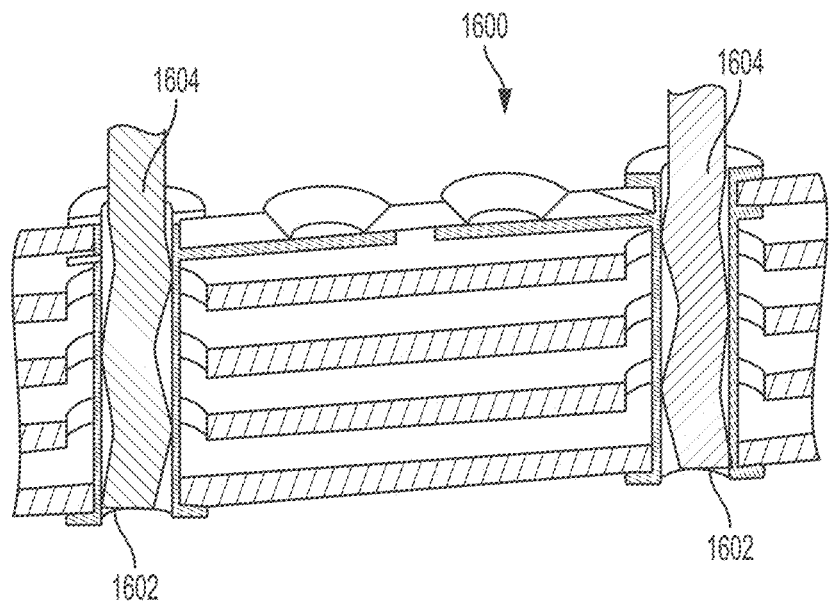
FIG. 16B is a cross-sectional view of the portion of an interconnection system of FIG. 16A above the critical transition temperature, in a fully mated configuration.

The inventors have recognized and appreciated that the shape memory effect discussed above may be utilized to provide electrical connectors which require very little or no force during the initial mating process. FIGS. 16A and 16B depict an illustrative embodiment of a portion of such a connector 1600. For example, the illustrated portion may form part of a signal launch to provide a connection to a printed circuit board, or it may be used in any other suitable portion of a connector. FIG. 16A shows a partially mated configuration in which the connector portion is cooled below the transition temperature. The superelastic wires 1604 may be trained to be substantially straight when below the transition temperature, such that they do not contact the side walls of the receptacles 1602. Therefore, the superelastic wires 1604 may be inserted into the receptacles with no, or minimal force. FIG. 16B shows the connector in the fully mated configuration, and after the connector has been warmed to a temperature above the transition temperature. The superelastic wires 1604 undergo a shape change such that the wires contact the sidewalls of receptacles 1602 at multiple contact points to create a suitable connection. The particular shape of the superelastic wires above the transition temperature may be controlled by suitable training (e.g. heat treatment) to provide a contact which achieves a desired contact force. If desired, the connector may be subsequently removed by cooling the connector below the transition temperature to again induce the phase transformation and cause the superelastic wires 1604 to revert to the straight shape for facile removal. Preferably, the transition temperature is below room temperature, or alternatively, the operating temperature of the connector, such that the connector does not become inadvertently disconnected during normal operation.

The various components and/or portions of connectors described herein may be included in any suitable combination as a part of an interconnection system. For example, FIG. 17 depicts one embodiment of an electrical interconnection system 1700, illustrating an environment in which any of the above-described embodiments may be applied. The electrical interconnection system 1700 includes a daughtercard connector 1720 and a backplane connector 1750. Daughtercard connector 1720 is designed to mate with backplane connector 1750, creating electronically conducting paths between backplane 1760 and daughtercard 1740. Though not expressly shown, interconnection system 1700 may interconnect multiple daughter cards having similar daughter card connectors that mate to similar backplane connections on backplane 1760.

Figure 17:
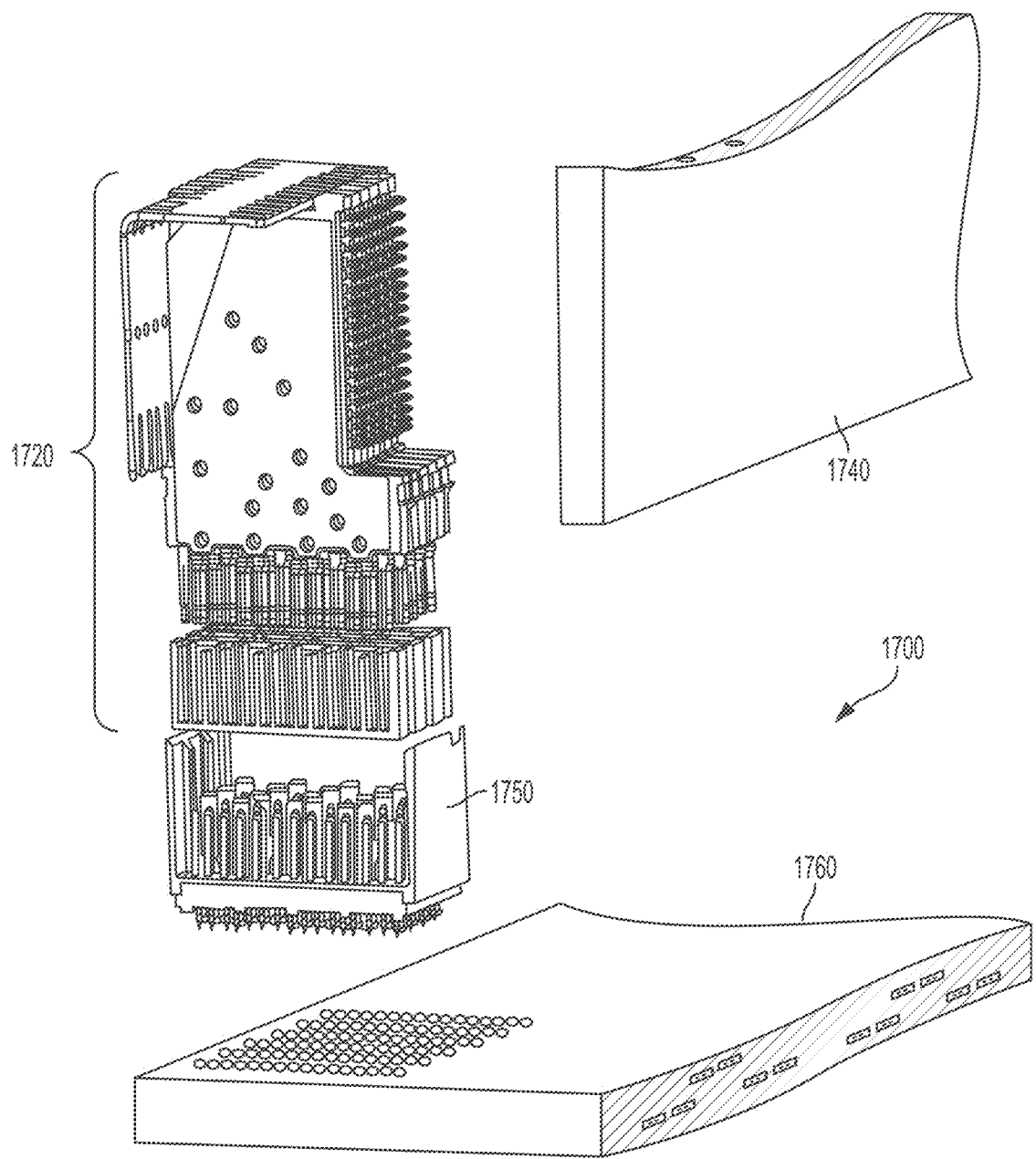
FIG. 17 is a perspective view of an electrical interconnection system illustrating an environment in which certain embodiments may be applied.

Though FIG. 17 illustrates an interconnection system which does not necessarily include superelastic components, conductive elements containing superelastic mating contact portions and/or conductive receptacles containing superelastic portions as described above, may be substituted for some or all of the conductive elements illustrated in FIG. 17.

Further, although various embodiments described herein include one or more components including superelastic materials, it should be understood that the current disclosure is not limited in this regard. For example, in some instances, the components may include materials that are not technically superelastic, but may include one or more compliant materials which are operated below their yield stress (and thus do not undergo plastic deformation). In other embodiments, non-superelastic materials may be included and may be operated above their yield stresses, and therefore these components may not be re-usable.

While the present teachings have been described in conjunction with various embodiments and examples, it is not intended that the present teachings be limited to such embodiments or examples. On the contrary, the present teachings encompass various alternatives, modifications, and equivalents, as will be appreciated by those of skill in the art. Accordingly, the foregoing description and drawings are by way of example only.

What is claimed is:

1. An electrical connector, comprising:
a plurality of contact elements disposed in an array, each of the plurality of contact elements comprising a contact tail and a mating contact portion,
wherein at least a portion of the contact element comprises an elongated member formed from a superelastic material, wherein:
the superelastic material is characterized by a stress-strain curve having a superelastic regime; and
deformation of the superelastic material within the superelastic regime results in at least a partial phase transformation of the elongated member.

2. The electrical connector of claim 1, wherein the at least a portion of the contact element is a superelastic wire.

3. The electrical connector of claim 2, wherein the diameter of the superelastic wire is between 5 and 10 mils.

4. The electrical connector of claim 1, wherein the at least a portion of the contact element is the mating contact portion.

5. The electrical connector of claim 4, wherein the mating contact portion is a pin.

6. The electrical connector of claim 5, wherein the contact element further comprises a non-superelastic portion affixed to the pin.

7. The electrical connector of claim 6, wherein the non-superelastic portion is a copper alloy.

8. The electrical connector of claim 7, wherein the copper alloy is phosphor bronze.

9. The electrical connector of claim 1, wherein the at least a portion of the contact element is the contact tail.

10. The electrical connector of claim 1, further comprising:
an insulative housing, wherein the plurality of contact elements are supported by the insulative housing.

11. The electrical connector of claim 10, wherein the insulative housing comprises:
a plurality of cavities, wherein the at least a portion of each of the plurality of contact elements is disposed within a cavity of the plurality of cavities.

12. The electrical connector of claim 10, wherein the insulative housing comprises:
a surface, wherein the at least a portion of each of the plurality of contact elements extends through the surface.

13. The electrical connector of claim 12, wherein:
the surface comprises relief features adjacent the contact elements.

14. The electrical connector of claim 1, wherein the phase transformation of the superelastic material comprises a reversible martensitic phase transformation.

15. The electrical connector of claim 1, wherein the superelastic material is nickel titanium.

16. The electrical connector of claim 1, wherein the portion of the contact element has a first conductivity and the contact element further comprises a coating on the portion having a second conductivity that is greater than the first conductivity.

17. An electrical connector, comprising:
an array of mating ends; and
an array of contact tails connected to the array of mating ends and configured for mounting to a substrate, wherein contact tails of the array of contact tails comprise a superelastic material, and
wherein:
the superelastic material is characterized by a stress-strain curve having a superelastic regime; and
deformation of the superelastic material within the superelastic regime results in at least a partial phase transformation of the elongated member.

18. The electrical connector of claim 17, wherein:
mating ends of the array of mating ends comprise a superelastic material;
the array of mating ends faces a first direction; and
the array of contact tails faces a second direction opposite the first direction.

19. The electrical connector of claim 17, wherein:
mating ends of the array of mating ends comprise a superelastic material;
the array of mating ends faces a first direction; and
the array of contact tails faces a second direction perpendicular to the first direction.

20. The electrical connector of claim 17, wherein the contact tails have a diameter of between 5 mils and 10 mils.

21. The electrical connector of claim 17 in combination with a substrate comprising holes, wherein the contact tails are inserted into the holes of the substrate, and wherein the holes have a drilled diameter between 10 mils and 15 mils.

22. The electrical connector of claim 17, wherein the array of contact tails comprises:
signal contact tails; and
ground contact tails disposed alongside the signal contact tails.

23. The electrical connector of claim 22, wherein:
ones of the ground contact tails are disposed between adjacent pairs of the signal contact tails.

24. A connector module, comprising:
a pair of conductive elements, comprising:
mating portions;
contact tails; and
intermediate portions connecting the mating portions to the contact tails; and
an insulative member holding the intermediate portions; wherein the mating portions and/or the contact tails comprise a superelastic material, and
wherein:
the superelastic material is characterized by a stress-strain curve having a superelastic regime; and
deformation of the superelastic material within the superelastic regime results in at least a partial phase transformation of the elongated member.

25. The connector module of claim 24, further comprising:
ground conductors alongside the pair of conductive elements, wherein the ground conductors terminate in ground contact tails.

26. The connector module of claim 24, wherein the pair of conductive elements is elongated along a first direction from the contact tails to the mating portions.

27. The connector module of claim 24, wherein the mating portions are elongated along a first direction and the contact tails are elongated along a second direction perpendicular to the first direction.

28. An electrical connector comprising a plurality of connector modules of claim 24 held in an array.

* * * * *